United States Patent
Yamada et al.

(10) Patent No.: US 11,567,143 B2
(45) Date of Patent: Jan. 31, 2023

(54) PARTIAL DISCHARGE DETERMINATION DEVICE AND METHOD

(71) Applicant: Hitachi, Ltd., Tokyo (JP)

(72) Inventors: Hiromichi Yamada, Tokyo (JP); Mitsuyasu Kido, Tokyo (JP)

(73) Assignee: HITACHI, LTD., Tokyo (JP)

( * ) Notice: Subject to any disclaimer, the term of this patent is extended or adjusted under 35 U.S.C. 154(b) by 179 days.

(21) Appl. No.: 17/098,771

(22) Filed: Nov. 16, 2020

(65) Prior Publication Data
US 2021/0231747 A1 Jul. 29, 2021

(30) Foreign Application Priority Data
Jan. 28, 2020 (JP) .............................. JP2020-011675

(51) Int. Cl.
*G01R 31/52* (2020.01)
*G01R 31/58* (2020.01)
*G06N 3/08* (2006.01)

(52) U.S. Cl.
CPC ............. *G01R 31/52* (2020.01); *G01R 31/58* (2020.01); *G06N 3/08* (2013.01)

(58) Field of Classification Search
CPC ........... G01R 31/52; G01R 31/58; G06N 3/08
See application file for complete search history.

(56) References Cited

U.S. PATENT DOCUMENTS

2018/0217198 A1   8/2018 Palme et al.

FOREIGN PATENT DOCUMENTS

| JP | 10-078471 A | | 3/1998 |
| JP | H1078471 A | * | 3/1998 |
| KR | 101574615 B1 | * | 12/2015 |

OTHER PUBLICATIONS

Yu-Hsun Lin "Using K-Means Clustering and Parameter Weighting for Partial-Discharge Noise Suppression", Journal IEEE Transactions on Power Delivery, vol. 26, No. 4, Oct. 2011 (Year: 2011).*

(Continued)

*Primary Examiner* — Nasima Monsur
*Assistant Examiner* — Dilara Sultana
(74) *Attorney, Agent, or Firm* — Mattingly & Malur, PC

(57) ABSTRACT

An object of the present invention is to propose a partial discharge determination device and method that can highly reliably determine the degree of progress of partial discharge occurring in an underground power transmission cable without preparing plural standard patterns. A distribution pattern of a set of the charge amount and the occurrence phase angle of each partial discharge occurring in a period of one or more cycles of an applied voltage of a power transmission cable is sequentially generated, a first classification process in which the pattern is classified into any one of classes on the basis of a standard distribution pattern for each class and a second classification process in which the distribution pattern are executed, a classification result by the first classification process is evaluated on the basis of a classification result by the second classification process, and the degree of progress is determined.

4 Claims, 16 Drawing Sheets

(56) References Cited

OTHER PUBLICATIONS

Min Wu et al. "An Overview of State-of-the-Art Partial Discharge Analysis Techniques for Condition Monitoring", Data Analytics Department, Institute for Infocomm Research, A*STAR, 1 Fusionopolis Way #21-01 Connexis, Singapore 138632. (Year: 2015).*
Extended European Search Report received in corresponding European Application No. 20207358.1 dated Apr. 26, 2021.
Min, W. et al., "An Overview of State-of-the-Art Partial Discharge Analysis Techniques for Condition Monitoring", IEEE Electrical Insulation Magazine, Nov. 1, 2015, pp. 22-35, vol. 31, No. 6.

* cited by examiner

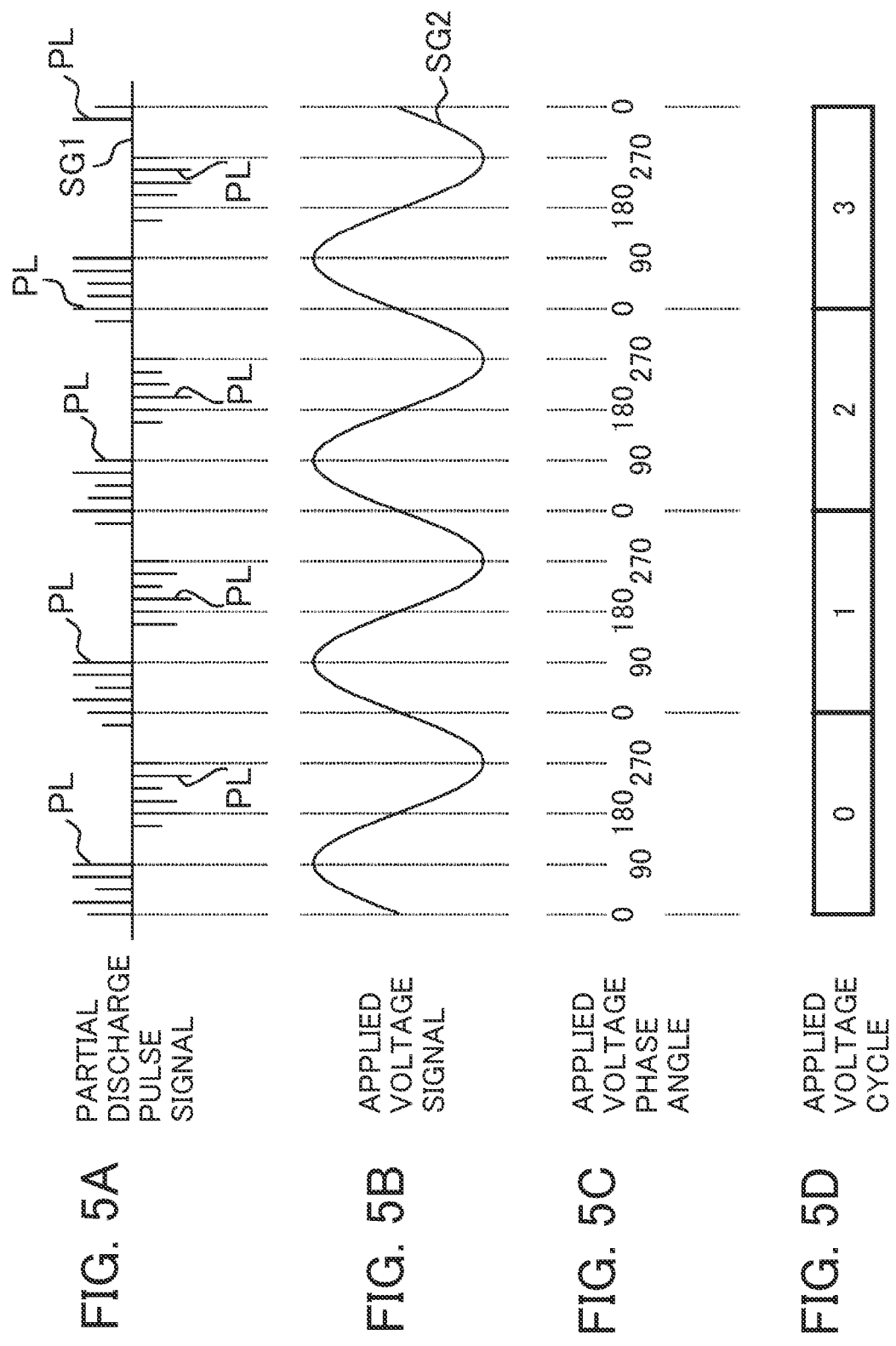

FIG. 8A WHEN PARTIAL DISCHARGE IS STARTED
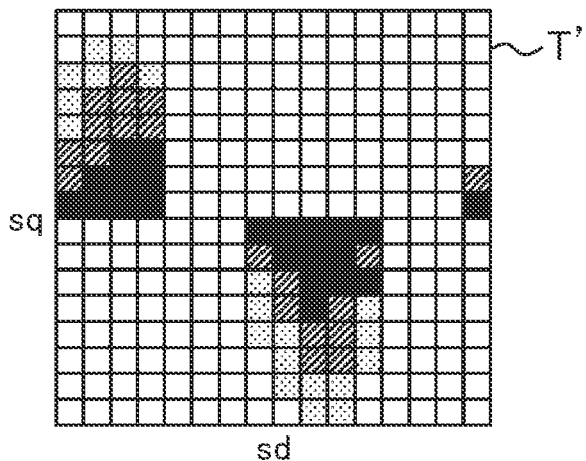
FIG. 8B IN THE MIDDLE STAGE OF PARTIAL DISCHARGE
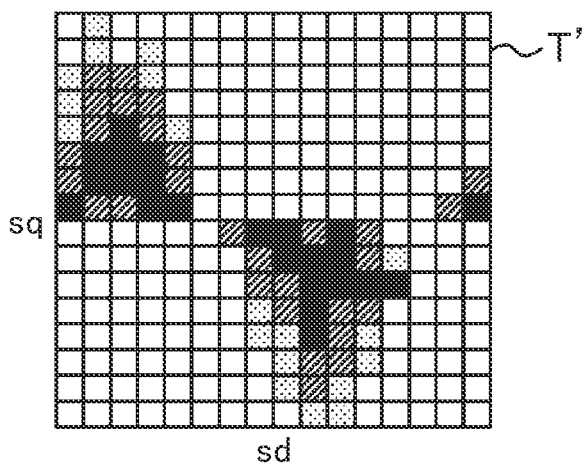
FIG. 8C IMMEDIATELY BEFORE BREAKDOWN
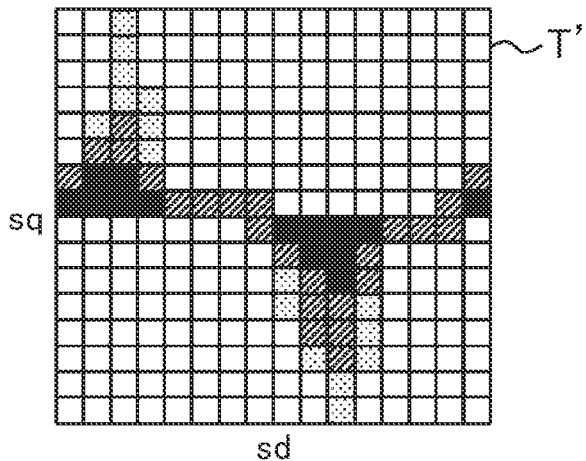

FIG. 12

| NO. | CLASSIFICATION RESULT 1 | CLASSIFICATION RESULT 2 | RELIABILITY | EVALUATION |
|---|---|---|---|---|
| 1 | 0 | A1 | 1 | PERMISSION |
| 2 | 0 | A1 | 1 | PERMISSION |
| 3 | 0 | A1 | 1 | PERMISSION |
| 4 | 0 | A1 | 1 | PERMISSION |
| 5 | 0 | A1 | 1 | PERMISSION |
| 6 | 0 | A1 | 1 | PERMISSION |
| 7 | 0 | A1 | 1 | PERMISSION |
| 8 | 0 | A1 | 1 | PERMISSION |
| 9 | 1 | A2 | 1 | PERMISSION |
| 10 | 1 | A2 | 1 | PERMISSION |
| 11 | 1 | A2 | 1 | PERMISSION |
| 12 | 1 | A2 | 1 | PERMISSION |
| 13 | 1 | A2 | 1 | PERMISSION |
| 14 | 1 | A2 | 1 | PERMISSION |
| 15 | 1 | A2 | 1 | PERMISSION |
| 16 | 1 | A2 | 1 | PERMISSION |

FIG. 13

| No. | CLASSIFICATION RESULT 1 | CLASSIFICATION RESULT 2 | RELIABILITY | EVALUATION |
|---|---|---|---|---|
| 1 | 0 | A1 | 1 | PERMISSION |
| 2 | 0 | A1 | 1 | PERMISSION |
| 3 | 0 | A1 | 1 | PERMISSION |
| 4 | 0 | A1 | 1 | PERMISSION |
| 5 | 0 | A1 | 1 | PERMISSION |
| 6 | 0 | A1 | 1 | PERMISSION |
| 7 | 0 | A1 | 1 | PERMISSION |
| 8 | 0 | A1 | 1 | PERMISSION |
| 9 | 0 | A2 | 0.802 | PERMISSION |
| 10 | 0 | A2 | 0.68 | PERMISSION |
| 11 | 0 | A2 | 0.603 | PERMISSION |
| 12 | 0 | A2 | 0.555 | PERMISSION |
| 13 | 0 | A2 | 0.526 | PERMISSION |
| 14 | 0 | A2 | 0.51 | PERMISSION |
| 15 | 0 | A2 | 0.502 | PERMISSION |
| 16 | 0 | A2 | 0.5 | NON-PERMISSION |

FIG. 14

| No. | CLASSIFICATION RESULT 1 | CLASSIFICATION RESULT 2 | RELIABILITY | EVALUATION |
|---|---|---|---|---|
| 1 | 0 | A1 | 1 | PERMISSION |
| 2 | 0 | A1 | 1 | PERMISSION |
| 3 | 0 | A1 | 1 | PERMISSION |
| 4 | 0 | A1 | 1 | PERMISSION |
| 5 | 0 | A1 | 1 | PERMISSION |
| 6 | 0 | A1 | 1 | PERMISSION |
| 7 | 0 | A1 | 1 | PERMISSION |
| 8 | 0 | A1 | 1 | PERMISSION |
| 9 | 1 | A1 | 1 | PERMISSION |
| 10 | 1 | A1 | 1 | PERMISSION |
| 11 | 1 | A1 | 1 | PERMISSION |
| 12 | 1 | A1 | 1 | PERMISSION |
| 13 | 1 | A1 | 1 | PERMISSION |
| 14 | 1 | A1 | 1 | PERMISSION |
| 15 | 1 | A1 | 1 | PERMISSION |
| 16 | 1 | A1 | 1 | PERMISSION |

PARTIAL DISCHARGE DETERMINATION DEVICE AND METHOD

CROSS-REFERENCE TO RELATED APPLICATION

The present application claims priority from Japanese application JP 2020-011675, filed on Jan. 28, 2020, the contents of which is hereby incorporated by reference into this application.

BACKGROUND

The present invention relates to a partial discharge determination device and method, and is suitable by being applied to, for example, a partial discharge determination device that determines the insulation deterioration of an underground power transmission cable.

In urban areas, huge power transmission networks are set up in the ground, and electric power generated by a power plant is transmitted to each power user through the power transmission networks. Underground power transmission facilities were increased in the period of high economic growth, and 40 years has passed currently since the start of the operation in many cases. Thus, a diagnostic technique of the aged deterioration has become important.

A partial discharge measurement method is one of deterioration diagnostic techniques of an underground power transmission cable. The underground power transmission cable has a structure in which a conductor where a current flows is covered with an insulator. In the case where a void is present in the insulator due to aged deterioration, partial discharge occurs in the part, finally led to breakdown. In the partial discharge measurement method, such partial discharge is monitored, and a degree of the insulation deterioration of the underground power transmission cable is diagnosed on the basis of the monitoring result. In various companies and research institutions, clarification of a partial discharge occurrence mechanism and a research for estimating the degree of insulation deterioration based on partial discharge characteristics have been advanced so far.

For example, in "Fumitaka Komori and other three, "Insulation deterioration diagnosis and remaining life estimation to which pattern recognition using partial discharge occurrence phase angle distribution is applied", IEEJ, 1993, Vol. 113-A. No. 8, p. 586-593", described is a deterioration diagnosis estimation method in which a measurement result of phase angle characteristics of partial discharge pulses from the start of charging to breakdown using electrodes for experimental purposes and a method of pattern recognition are applied. The phase angle characteristics of partial discharge pulses are characteristics of a distribution pattern of the charge amount and the occurrence phase angle of partial discharge pulses during plural cycles of an applied voltage. In five periods of time from the start of charging to breakdown, changes in a phase angle region where partial discharge occurs and in the range of the occurrence charge amount are shown. In the deterioration diagnosis estimation method, the phase angle characteristics of partial discharge are patterned into standardized charge amount/standardized phase angle/occurrence frequency, and the pattern is compared with preliminarily-created standard patterns according to the degree of deterioration in terms of resemblance.

In addition, in Japanese Unexamined Patent Application Publication No. Hei 10(1998)-78471, described is a partial discharge measurement method in which the presence or absence of partial discharge can be determined using a neural network. A pattern used in the technique is different from that used in "Fumitaka Komori and other three, "Insulation deterioration diagnosis and remaining life estimation to which pattern recognition using partial discharge occurrence phase angle distribution is applied", IEEJ, 1993, Vol. 113-A. No. 8, p. 586-593", standardized charge amounts and standardized phase angles are listed in time series for each t-cycle. In the method of "Fumitaka Komori and other three, "Insulation deterioration diagnosis and remaining life estimation to which pattern recognition using partial discharge occurrence phase angle distribution is applied", IEEJ, 1993, Vol. 113-A. No. 8, p. 586-593", the charge amount and the phase angle are patterned together as occurrence frequency in plural cycles (600 cycles). Thus, time information of the occurrence phase angle is lost, and wrong determination of the presence or absence of partial discharge disadvantageously occurs in some cases.

SUMMARY

Incidentally, in the deterioration diagnosis estimation method disclosed in "Fumitaka Komori and other three, "Insulation deterioration diagnosis and remaining life estimation to which pattern recognition using partial discharge occurrence phase angle distribution is applied", IEEJ, 1993, Vol. 113-A. No. 8, p. 586-593", the phase angle characteristics of partial discharge according to the degree of deterioration are preliminarily created as standard patterns, and the standard pattern to which the phase angle characteristics of a measured signal are the most similar is selected. In addition, in the partial discharge measurement method disclosed in Japanese Unexamined Patent Application Publication No. Hei 10(1998)-78471, the $\varphi$-q-t pattern of standardized charge amount/standardized phase angle listed in time series is learned by a neural network, and the $\varphi$-q-t pattern of a measured signal is input into the learned neural network to determine the presence or absence of partial discharge.

As described above, "Fumitaka Komori and other three, "Insulation deterioration diagnosis and remaining life estimation to which pattern recognition using partial discharge occurrence phase angle distribution is applied", IEEJ, 1993, Vol. 113-A. No. 8, p. 586-593" and Japanese Unexamined Patent Application Publication No. Hei 10(1998)-78471 are methods in which the pattern of a measured signal matches the standard pattern of partial discharge. Thus, in the case where a pattern having high similarity to the pattern of the measured signal is present in the standard patterns, a good diagnosis result can be obtained. However, in the case where a pattern having high similarity to the pattern of the measured signal is not present in the standard patterns, a good diagnosis result cannot be obtained.

Namely, according to the methods disclosed in "Fumitaka Komori and other three, "Insulation deterioration diagnosis and remaining life estimation to which pattern recognition using partial discharge occurrence phase angle distribution is applied", IEEJ, 1993, Vol. 113-A. No. 8, p. 586-593" and Japanese Unexamined Patent Application Publication No. Hei 10(1998)-78471, it is necessary to prepare sufficient standard patterns of partial discharge. Thus, it is complicated work to create plural standard patterns according to the degree of insulation deterioration by obtaining measurement data of partial discharge, and it disadvantageously takes time.

The present invention has been made in consideration of the above-described points, and is to propose a partial discharge determination device and method that can highly reliably determine the degree of progress of partial discharge without preparing plural standard patterns.

In order to solve the problems, the present invention provides a partial discharge determination device that determines the degree of progress of partial discharge occurring in a power transmission cable, the device including: a distribution pattern generation unit that sequentially generates a distribution pattern of a set of the charge amount and the occurrence phase angle of each partial discharge occurring in a period of one or more cycles of an applied voltage of the power transmission cable; a first classification unit that classifies the distribution pattern generated by the distribution pattern generation unit into any one of classes on the basis of a standard distribution pattern for each class; a second classification unit that classifies the distribution pattern generated by the distribution pattern generation unit into any one of clusters by clustering; an evaluation unit that evaluates a classification result of the first classification unit on the basis of a classification result of the second classification unit; and a determination unit that determines the degree of progress of the partial discharge occurring in the power transmission cable on the basis of an evaluation result of the evaluation unit.

In addition, the present invention provides a partial discharge determination method executed by a partial discharge determination device that determines the degree of progress of partial discharge occurring in a power transmission cable, the method including: a first step of sequentially generating a distribution pattern of a set of the charge amount and the occurrence phase angle of each partial discharge occurring in a period of one or more cycles of an applied voltage of the power transmission cable; a second step of executing a first classification process in which the generated distribution pattern is classified into any one of classes on the basis of a standard distribution pattern for each class and a second classification process in which the distribution pattern generated by the distribution pattern generation unit is classified into any one of clusters by clustering; a third step of evaluating a classification result by the first classification process on the basis of a classification result by the second classification process; and a fourth step of determining the degree of progress of the partial discharge occurring in the power transmission cable on the basis of an evaluation result in the third step.

According to the present invention, it is possible to realize a partial discharge determination device and method that can highly reliably determine the degree of progress of partial discharge occurring in an underground power transmission cable without preparing plural standard patterns.

BRIEF DESCRIPTION OF THE DRAWINGS

FIGS. 5A to 5D are diagrams each describing a partial discharge pulse signal and an applied voltage signal;

FIG. 8A is a diagram for showing a state of a standardized partial discharge charge amount phase angle distribution pattern when the partial discharge is started, FIG. 8B is a diagram for showing a state of the standardized partial discharge charge amount phase angle distribution pattern in the middle stage of the partial discharge, and FIG. 8C is a diagram for showing a state of the standardized partial discharge charge amount phase angle distribution pattern immediately before breakdown;

FIG. 12 is a table summarizing a classification result 1 and a classification result 2, the reliability of the classification result 1 calculated on the basis of the classification result 2, and the evaluation of an evaluation unit for the classification result 1 calculated on the basis of the reliability for the standardized partial discharge charge amount phase angle distribution patterns in the example of FIG. 9;

FIG. 13 is a table summarizing the classification result 1 and the classification result 2, the reliability of the classification result 1 calculated on the basis of the classification result 2, and the evaluation of the evaluation unit for the classification result 1 calculated on the basis of the reliability for the standardized partial discharge charge amount phase angle distribution patterns in the example of FIG. 10;

FIG. 14 is a table summarizing the classification result 1 and the classification result 2, the reliability of the classification result 1 calculated on the basis of the classification result 2, and the evaluation of the evaluation unit for the classification result 1 calculated on the basis of the reliability for the standardized partial discharge charge amount phase angle distribution patterns in the example of FIG. 11;

DETAILED DESCRIPTION

Hereinafter, one embodiment of the present invention will be described in detail with reference to the drawings.

(1) First Embodiment

Figure 1:
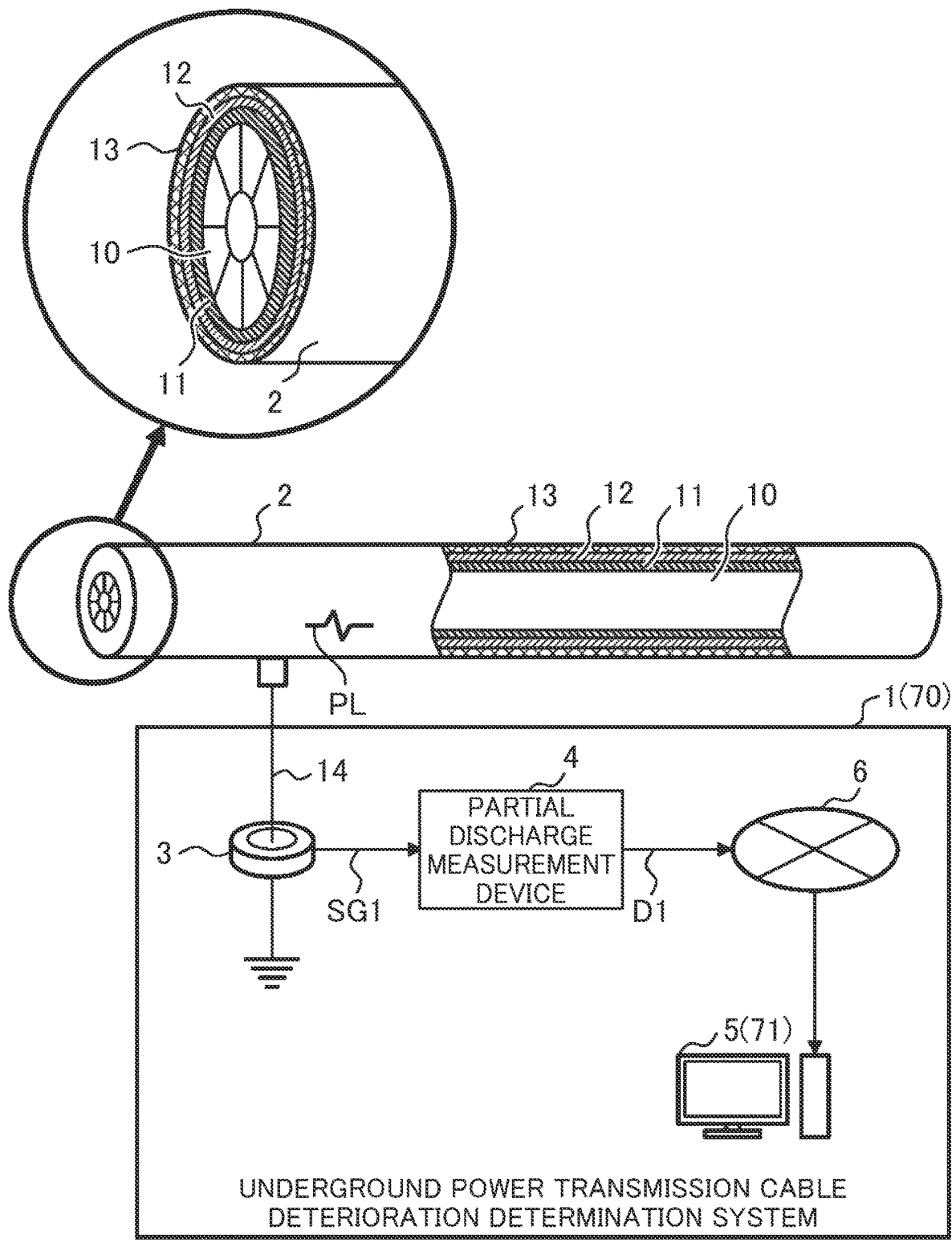
FIG. 1 is a block diagram for showing an entire configuration of an underground power transmission cable deterioration determination system according to first and second embodiments.

(1-1) Configuration of an Underground Power Transmission Cable Deterioration Determination System According to the Embodiment In FIG. 1, the reference numeral 1 denotes, as a whole, an underground power transmission cable deterioration determination system to which the present invention is applied. The underground power transmission cable deterioration determination system 1 is a system to monitor the insulation deterioration of an underground power transmission cable 2 by determining the degree of progress of partial discharge that occurs in the underground power transmission cable 2, and is configured by including a divided type high-frequency CT (Current Transformer) 3, a partial discharge measurement device 4, and a partial discharge determination device 5.

In the case where the underground power transmission cable 2 is an OF (Oil Filled) cable that maintains insulation with a kraft paper and oil, the underground power transmission cable 2 is configured by sequentially laminating an insulator 11 made of a kraft paper soaked in an insulation oil, an metal sheath 12 for enclosing oil, and an anticorrosion layer 13 for corrosion prevention on a conductor 10 in which electricity flows. In addition, the metal sheath 12 is grounded through a metal sheath grounding wire 14. Accordingly, when partial discharge PL occurs in the underground power transmission cable 2, the partial discharge pulse PL can be discharged to the ground through the metal sheath grounding wire 14.

The divided type high-frequency CT 3 is configured using a clamp type high-frequency current sensor, and is installed for each predetermined length of the underground power transmission cable 2. The divided type high-frequency CT 3 generates a partial discharge pulse signal SG1 including a pulse (that will be hereinafter referred to as a partial discharge pulse PL) that rises up to a voltage level according to the charge amount of each partial discharge pulse PL flowing in the metal sheath grounding wire 14, and transmits the generated partial discharge pulse signal SG1 to the partial discharge measurement device 4.

The partial discharge measurement device 4 is installed while being associated with each divided type high-frequency CT. The partial discharge measurement device 4 measures the charge amount of each partial discharge pulse PL included in the partial discharge pulse signal SG1 transmitted from the corresponding divided type high-frequency CT 3 and the phase angle of the voltage (that will be hereinafter referred to as an applied voltage) of electricity flowing in the underground power transmission cable (that will be hereinafter referred to as a target underground power transmission cable) 2 targeted at each time when each partial discharge pulse PL occurs, and transmits the measurement result to the partial discharge determination device 5 through a network 6 as partial discharge data D1.

On the basis of the partial discharge data D1 transmitted from each partial discharge measurement device 4, the partial discharge determination device 5 determines the degree of progress of the partial discharge occurring in the target underground power transmission cable 2, and displays the determination result.

Figure 2:
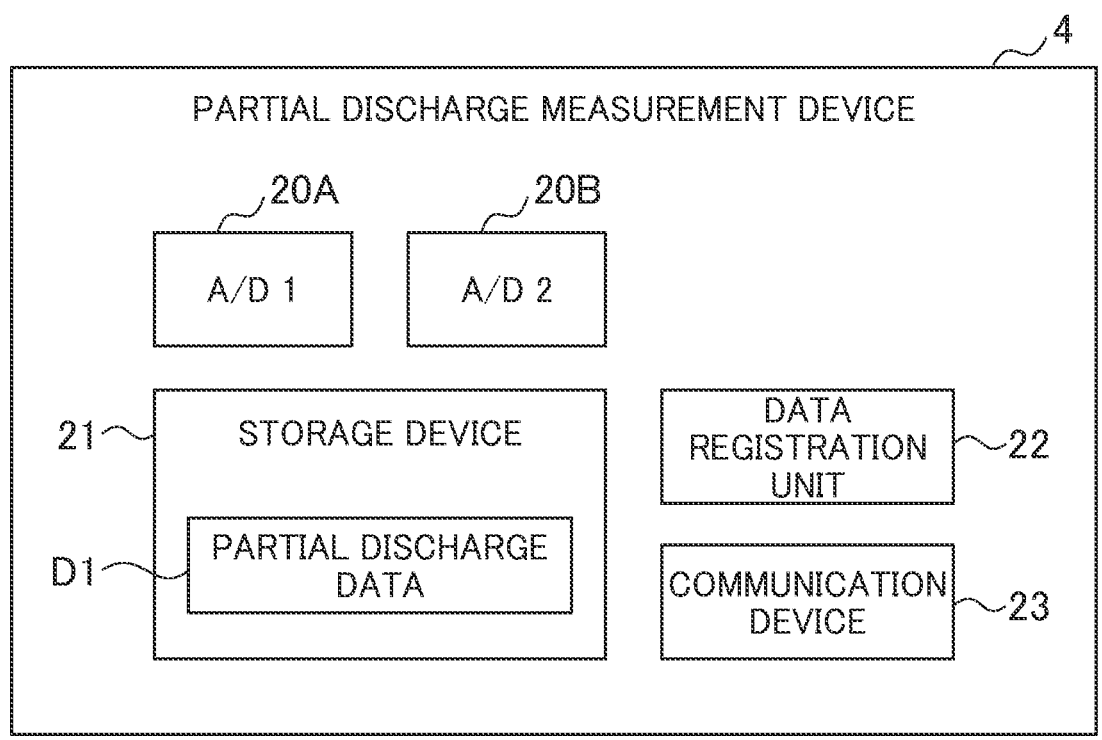
FIG. 2 is a block diagram for showing an outline hardware configuration of a partial discharge measurement device.

Here, FIG. 2 shows an outline hardware configuration of the partial discharge measurement device 4. As shown in FIG. 2, the partial discharge measurement device 4 is configured by including first and second A/D (Analog/Digital) converters 20A and 20B, a storage device 21, a data registration unit 22, and a communication device 23.

Each of the first and second A/D converters 20A and 20B is configured using a generic A/D converter. In addition, the storage device 21 is configured using a hard disk device, an SSD (Solid State Drive), a semiconductor memory, or the like. The storage device 21 stores the partial discharge data D1 containing the data of the charge amount of each partial discharge pulse PL and the phase angle obtained by the measurement.

The data registration unit 22 will be described later in detail. It should be noted that the data registration unit 22 may be configured using software. The communication device 23 is configured using an NIC (Network Interface Card) or the like, and performs protocol control when the partial discharge measurement device 4 communicates with the partial discharge determination device 5 through the network 6.

Figure 3:
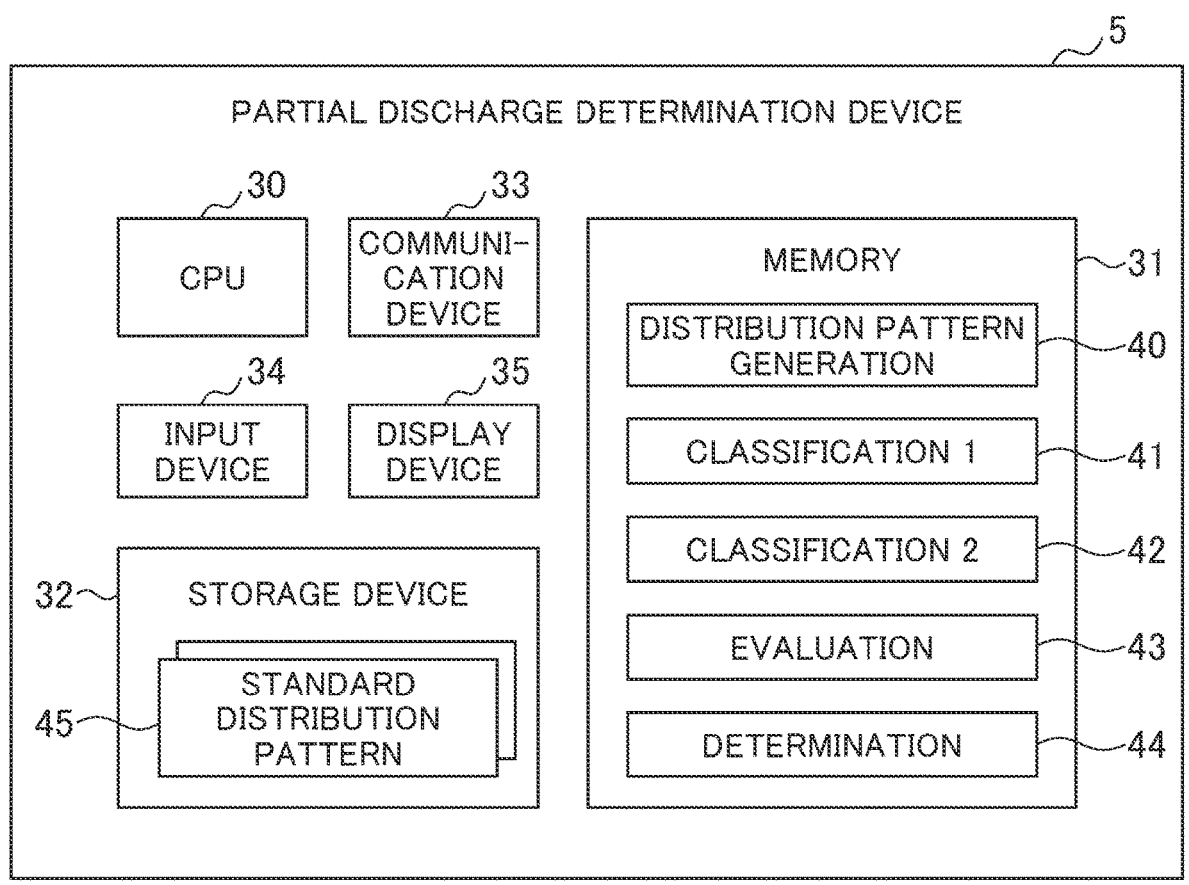
FIG. 3 is a block diagram for showing an outline hardware configuration of the partial discharge determination device according to the first embodiment.

On the other hand, FIG. 3 shows an outline hardware configuration of the partial discharge determination device 5. The partial discharge determination device 5 is configured using a generic computer device including a CPU (Central Processing Unit) 30, a memory 31, a storage device 32, a communication device 33, an input device 34, and a display device 35.

The CPU 30 is a processor that performs operation control of the entire partial discharge determination device 5. In addition, the memory 31 is configured using a volatile semiconductor memory or the like, and is used as a work memory of the CPU 30. A distribution pattern generation program 40, a first classification program 41, a second classification program 42, an evaluation program 43, and a determination program 44 to be described later are loaded from the storage device 32 to be held by the memory 31 when the partial discharge determination device 5 is started or if necessary.

The storage device 32 is configured using a non-volatile large capacity storage device such as a hard disk device, an SSD, or a flash memory, and stores various programs and data to be held for a long time. Data of a standard distribution pattern 45 to be described later is stored in and held by the storage device 32.

The communication device 33 is configured using an NIC or the like, and performs protocol control when the partial discharge determination device 5 communicates with the partial discharge measurement device 4 through the network 6. In addition, the input device 34 is a device used when a user inputs a necessary command or information into the partial discharge determination device 5, and is configured using, for example, a keyboard, a mouse, or the like. Further, the display device 35 is a device to display necessary information, and is configured using, for example, a liquid crystal panel, an organic EL (Electro Luminescence) panel, or the like.

Figure 4:
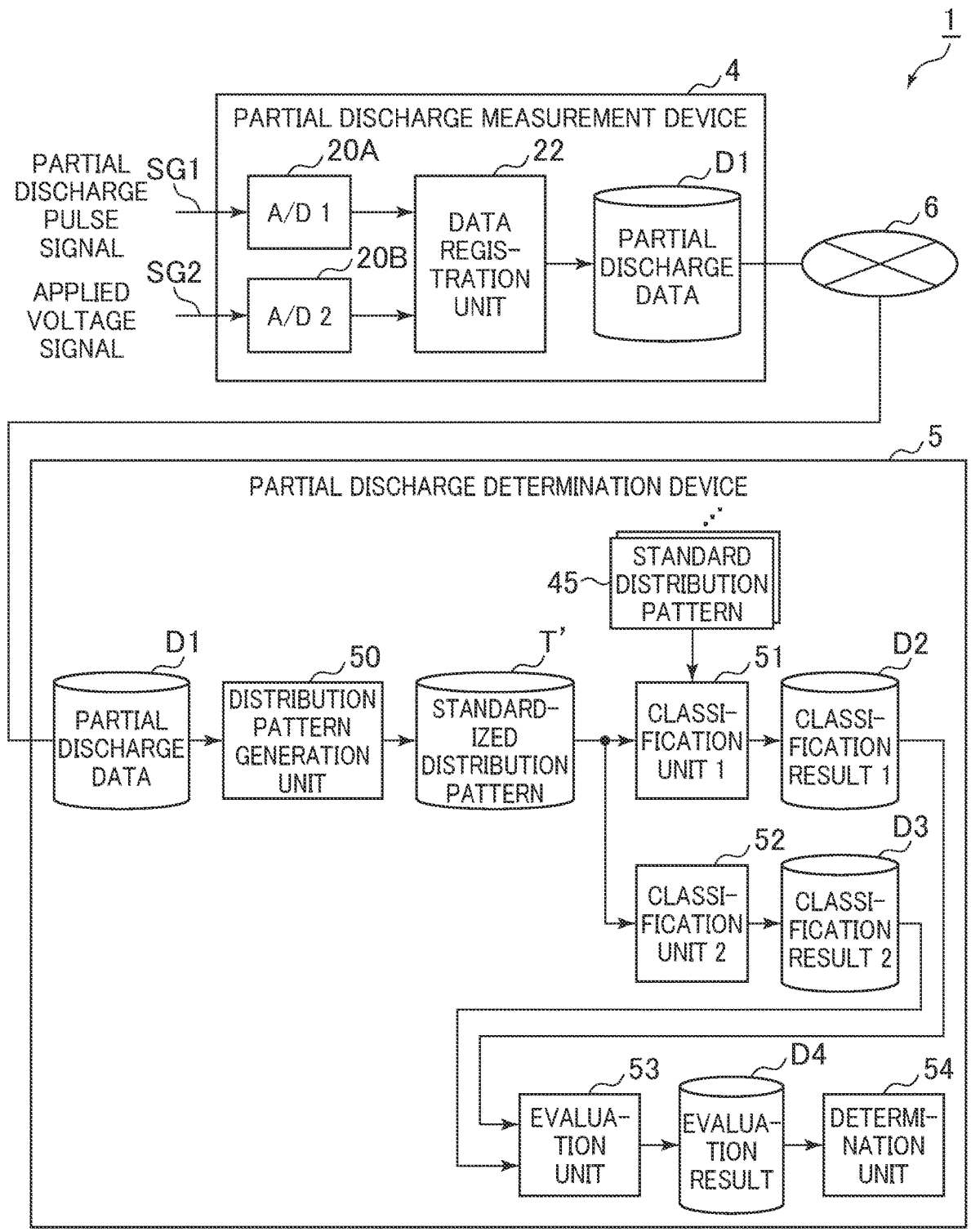
FIG. 4 is a block diagram for showing a flow of a series of processes in the underground power transmission cable deterioration determination system according to the first embodiment.

(1-2) Flow of Partial Discharge Determination Process in Underground Power Transmission Cable Deterioration Determination System FIG. 4 shows a flow of a series of processes (that will be hereinafter referred to as a partial discharge determination process) that is executed in the underground power transmission cable deterioration determination system 1 and determines the degree of progress of the partial discharge occurring in the target underground power transmission cable 2. In the drawing, a distribution pattern generation unit 50, a first classification unit 51, a second classification unit 52, an evaluation unit 53, and a determination unit 54 are functional units that are embodied in such a manner that the CPU 30 executes the distribution pattern generation program 40, the first classification program 41, the second classification program 42, the evaluation program 43, or the determination program 44 of FIG. 3 that are loaded from the storage device 32 (FIG. 3) into the memory 31 (FIG. 3) in the partial discharge determination device 5.

As shown in FIG. 4, in the underground power transmission cable deterioration determination system 1, the partial discharge pulse signal SG1 as shown in FIG. 5A output from the divided type high-frequency CT 3 (FIG. 1) is supplied to the first A/D converter 20A of the partial discharge measurement device 4. Then, the first A/D converter 20A converts the partial discharge pulse signal SG1 from analog to digital, and outputs the obtained digital data of the partial discharge pulse signal SG1 to the data registration unit 22.

In addition, an applied voltage signal SG2 as shown in FIG. 5B obtained by dropping the applied voltage of the target underground power transmission cable 2 to about 5V is supplied to the second A/D converter 20B of the partial discharge measurement device 4. Then, the second A/D converter 20B converts the applied voltage signal SG2 from analog to digital, and outputs the obtained digital data of the applied voltage signal SG2 to the data registration unit 22.

The data registration unit 22 extracts each partial discharge pulse PL included in the partial discharge pulse signal SG1, and obtains the digital value of the voltage value of each partial discharge pulse PL as the charge amount of each partial discharge pulse PL. In addition, the data registration unit 22 obtains, for each partial discharge pulse PL, the phase angle (that will be hereinafter referred to as the phase angle of the partial discharge pulse PL or an occurrence phase angle) of the applied voltage signal SG2 when the partial discharge pulse PL occurs. Then, the data registration unit 22 stores the obtained charge amount and phase angle of each partial discharge pulse PL into the storage device 21 (FIG. 2) as the partial discharge data D1.

The partial discharge data D1 is transmitted to the partial discharge determination device 5 by the communication device 23 (FIG. 2) of the partial discharge measurement device 4 through the network 6, and is stored into the storage device 32 (FIG. 3) through the communication device 33 (FIG. 3) of the partial discharge determination device 5. Thereafter, the partial discharge data D1 is read by the distribution pattern generation unit 50.

On the basis of the partial discharge data D1 of each partial discharge pulse PL read from the storage device 32, the distribution pattern generation unit 50 sequentially generates a standardized partial discharge charge amount phase angle distribution pattern T', to be described later in FIG. 7A to 7C, obtained by standardizing a distribution pattern (that will be hereinafter referred to as a partial discharge charge amount phase angle distribution pattern) T (see FIGS. 6A to 6C) of a combination of the charge amount and the phase angle of each partial discharge pulse PL occurring in a period of several cycles (a period corresponding to several applied voltage cycles of FIG. 5D) of the applied voltage signal SG2, and sequentially stores the generated data of the standardized partial discharge charge amount phase angle distribution pattern T' into the storage device 32 (FIG. 3).

Thereafter, each standardized partial discharge charge amount phase angle distribution pattern T' stored in the storage device 32 is sequentially read by the first and second classification units 51 and 52. Then, the first classification unit 51 compares each of the read standardized partial discharge charge amount phase angle distribution patterns T' with a standard standardized partial discharge charge amount phase angle distribution pattern (that will be hereinafter referred to as a standard distribution pattern) 45, which is preliminarily created and registered in the storage device 32, in each of some deterioration stages (that will be hereinafter referred to as a class) of the target underground power transmission cable 2 by means of pattern matching.

It should be noted that as the standard distribution pattern 45, the standard distribution patterns 45 of, at least, three classes when the partial discharge is started, in the middle stage of the partial discharge, and immediately before breakdown are included. In addition, as the pattern matching between each standardized partial discharge charge amount phase angle distribution pattern T' and the standard distribution pattern 45 of each class, a method of comparing values or a neural network with the standard distribution pattern 45 of each class leaned may be used.

Then, the first classification unit 51 classifies the standardized partial discharge charge amount phase angle distribution pattern T' into any one of classes in which the corresponding standard distribution pattern 45 is the most similar to the distribution pattern by the pattern matching, and the classified class is stored in the storage device 32 (FIG. 3) as a first classification result D2 while being associated with identification information of the standardized partial discharge charge amount phase angle distribution pattern T'.

In addition, the second classification unit 52 classifies the read standardized partial discharge charge amount phase angle distribution patterns T' into one or more clusters (clustering) using an algorithm such as a principal component analysis method or k-means clustering, and stores the classified cluster in the storage device 32 (FIG. 3) as a second classification result D3 while being associated with identification information of the standardized partial discharge charge amount phase angle distribution pattern T'.

The evaluation unit 53 sequentially reads the corresponding first classification result D2 and second classification result D3 from the storage device 32, and sequentially calculates reliability indicating the degree of reliability of the first classification result D2 using the second classification result D3.

Then, on the basis of the calculated reliability of the first classification result D2, the evaluation unit 53 evaluates, for each standardized partial discharge charge amount phase angle distribution pattern T', whether or not to permit to use information of the first classification result D2 when the determination unit 54 determines the degree of progress of the partial discharge in the target underground power transmission cable 2. In addition, the evaluation unit 53 stores the evaluation result for each standardized partial discharge charge amount phase angle distribution pattern T' into the storage device 32 as an evaluation result D4.

On the basis of the evaluation result D4 of the evaluation unit 53 stored in the storage device 32, the determination unit 54 determines, regularly or in accordance with a request from a user, the degree of progress of the partial discharge occurring in the target underground power transmission cable 2 using only the information of the standardized partial discharge charge amount phase angle distribution pattern T' that is permitted to be used, and displays the determination result on the display device 35 (FIG. 3).

Figure 6A:
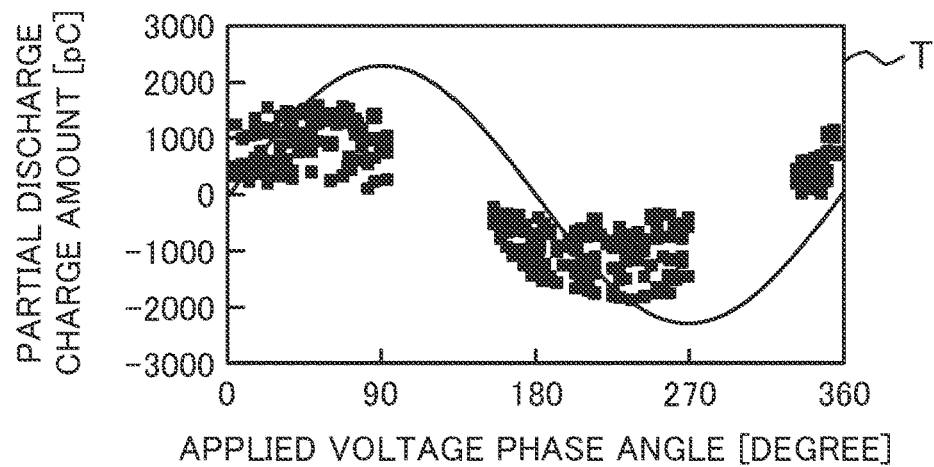
FIG. 6A is a diagram for showing a state of a partial discharge charge amount phase angle distribution pattern when partial discharge is started.
Figure 6B:
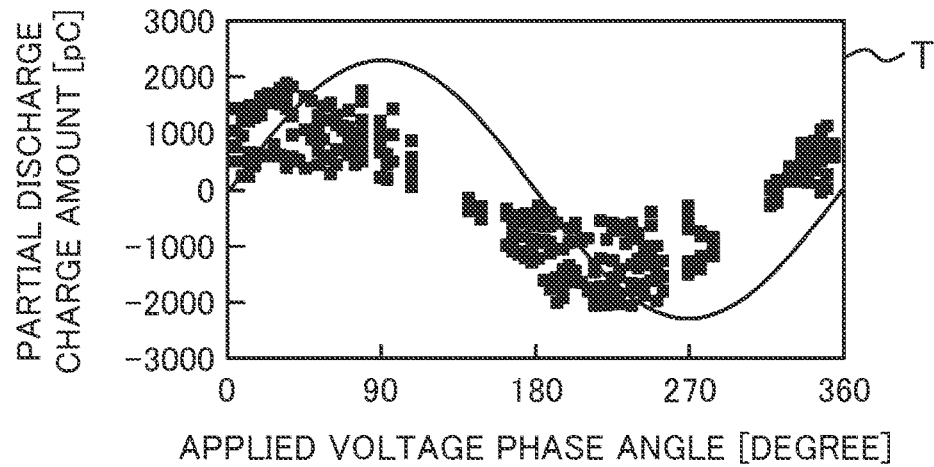
FIG. 6B is a diagram for showing a state of the partial discharge charge amount phase angle distribution pattern in the middle stage of the partial discharge.
Figure 6C:
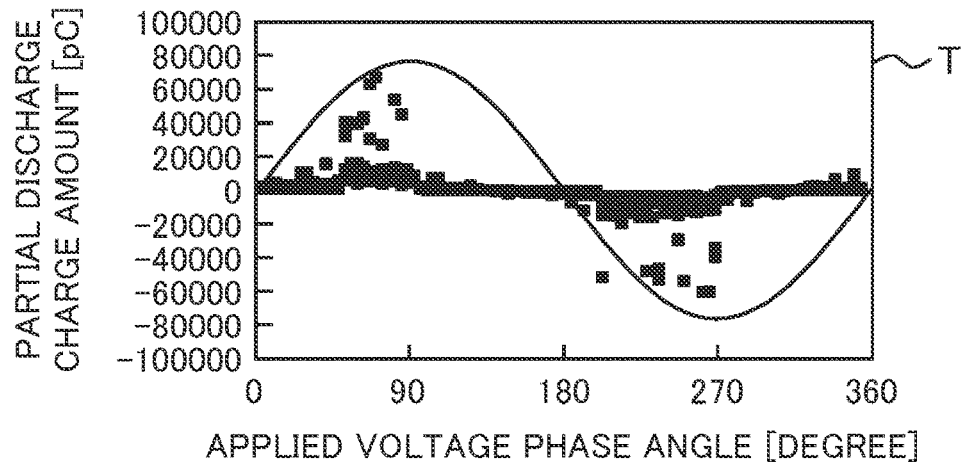
FIG. 6C is a diagram for showing a state of the partial discharge charge amount phase angle distribution pattern immediately before breakdown.

(1-3) Concrete Processing Content of Each Functional Unit of Partial Discharge Determination Device Here, each of FIGS. 6A to 6C shows an example of the partial discharge charge amount phase angle distribution pattern T in which a point indicating each partial discharge pulse PL occurring in a period of plural cycles (for example, 50 cycles) of the applied voltage is plotted on a coordinate plane where the vertical axis represents the charge amount of the partial discharge pulse PL and the horizontal axis represents the phase angle of the applied voltage.

FIG. 6A is an example of the partial discharge charge amount phase angle distribution pattern T when the partial discharge is started. In this example, positive partial discharge pulses PL occur around the zero crossing point from negative to positive of the applied voltage, and negative partial discharge pulses PL occur around the zero crossing point from positive to negative of the applied voltage. Specifically, the partial discharge pulses PL of the positive charge amount occur in a range from −30 to 90 degrees of the phase angle of the applied voltage, and the partial discharge pulses PL of the negative charge amount occur in a range from 150 to 270 degrees of the phase angle of the applied voltage.

In addition, FIG. 6B shows an example of the partial discharge charge amount phase angle distribution pattern T in the middle stage of the partial discharge. In the middle stage of the partial discharge, the charge amounts of the partial discharge pulses PL increase as compared to the distribution pattern of FIG. 6A, and further the range of the phase angle where the partial discharge pulses PL occur is enlarged.

Further, FIG. 6C shows an example of the partial discharge charge amount phase angle distribution pattern T immediately before breakdown in the later stage of the partial discharge. FIG. 6C shows that the partial discharge pulses PL occur in all the phase angles of the applied voltage, and the charge amounts range from tens of thousands of pC to—tens of thousands of pC.

As described above, the partial discharge charge amount phase angle distribution pattern T is gradually changed from the initial stage of the partial discharge to immediately before breakdown. Specifically, as the deterioration of the underground power transmission cable 2 due to the partial discharge advances, the occurrence places of the partial discharge increase as described above, and the charge amount of the partial discharge also increases.

Figure 7A:
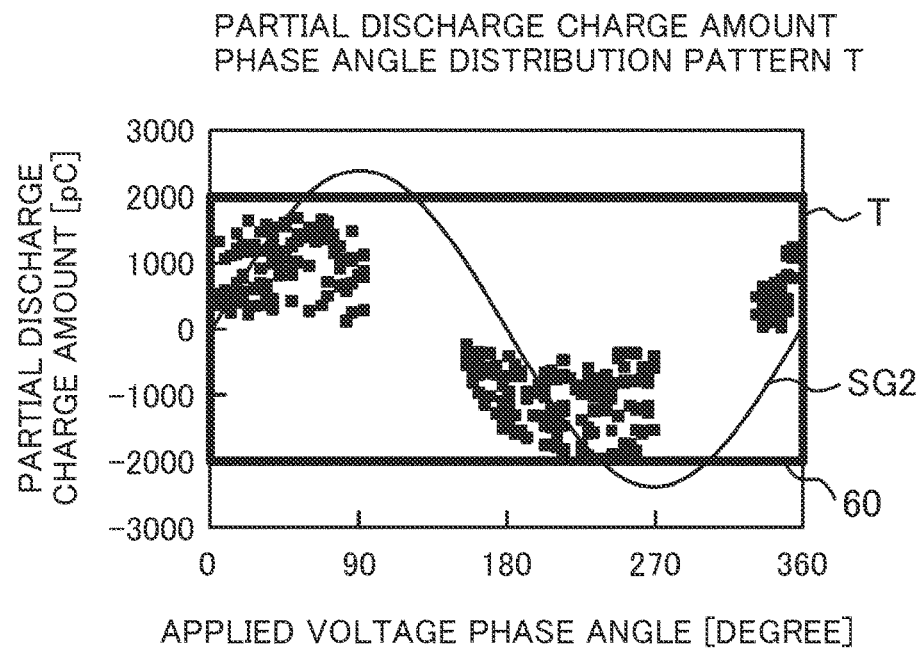
FIGS. 7A and 7B are diagrams each describing standardization of the partial discharge charge amount phase angle distribution pattern.
Figure 7B:
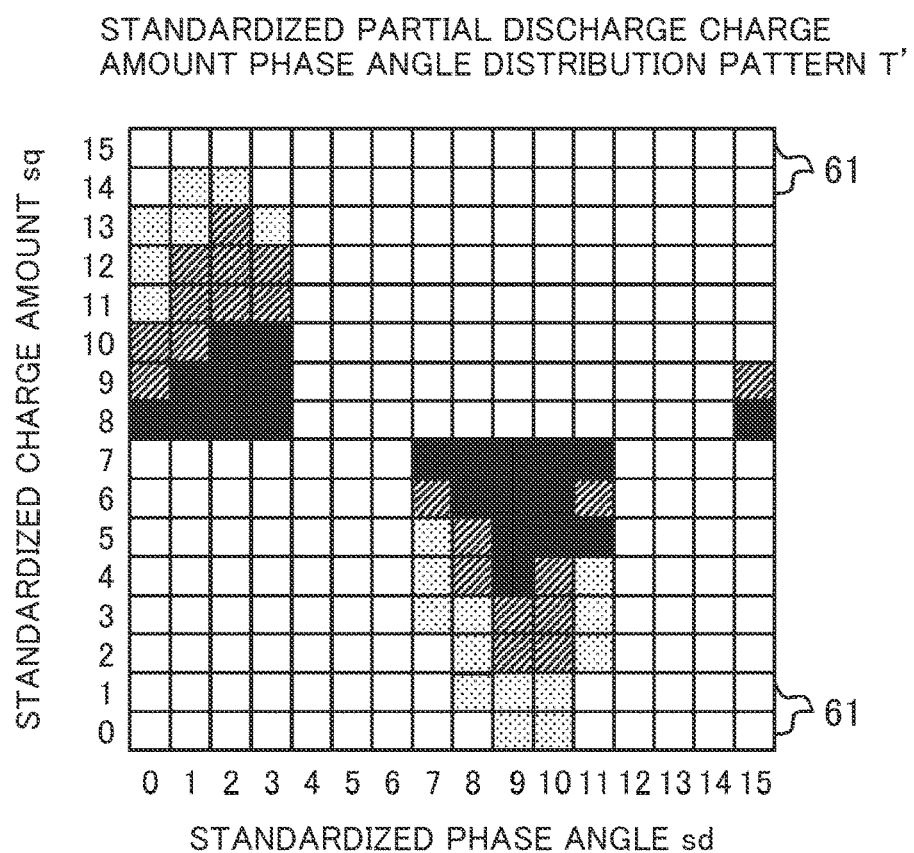

FIG. 7B shows the above-described standardized partial discharge charge amount phase angle distribution pattern T' obtained by standardizing the partial discharge charge amount phase angle distribution pattern T shown in FIG. 7A. In order for the first classification unit 51 (FIG. 4) to easily classify the distribution pattern of the partial discharge pulse PL into classes such as "when the partial discharge is started", "in the middle stage of the partial discharge", and "immediately before breakdown" using the neural network (FIG. 4), the distribution pattern generation unit 50 (FIG. 4) standardizes the partial discharge charge amount phase angle distribution pattern T as shown in FIG. 7A based on the partial discharge data D1 stored in the storage device 32, and generates the standardized partial discharge charge amount phase angle distribution pattern T' shown in FIG. 7B obtained by counting the number of times the partial discharge occurs for each combination of the standardized charge amount and the standardized phase angle.

Specifically, the distribution pattern generation unit 50 first sets a range (that will be hereinafter referred to as a window) 60 including therein all the points indicating the partial discharge pulses PL in FIG. 7A on the partial discharge charge amount phase angle distribution pattern T of FIG. 7A. At this time, the vertical length of the window 60 representing the discharge amount of the partial discharge is set so that the upper part from a charge amount of 0 is the same as the lower part from a charge amount of 0. Namely, the absolute value that is larger between those of the positive maximum value and the negative maximum value of the partial discharge charge amount corresponds to each length of the upper part from 0 and the lower part from 0 of the window 60.

Next, the distribution pattern generation unit 50 equally divides the vertical direction and the lateral direction of the window 60 of FIG. 7A into a predetermined number, and divides the inside of the window 60 into plural small regions (that will be hereinafter referred to as cells) 61 as shown in FIG. 7B. Then, the distribution pattern generation unit 50 sets counters (that will be hereinafter referred to as partial discharge pulse counters) that count the number of partial discharge pulses PL corresponding to the respective cells 61.

It should be noted that FIG. 7B is an example in which each of the vertical direction and the lateral direction of the window 60 is equally divided into 16 pieces. Each of the cells 61 in the vertical direction of FIG. 7B represents a standardized charge amount sq. Since the range of the vertical direction of the window 60 in FIG. 7A is from −2000 pC to +2000 pC, sq=0 corresponds to a range of −2000 pC or larger and smaller than −1750 pC, and sq=1 corresponds to a range of −1750 pC or larger and smaller than −1500 pC in FIG. 7B. The same applies to sq=2 to sq=6. In addition, sq=7 corresponds to a range of −250 pC or larger and smaller than 0 pC, sq=8 corresponds to a range of larger than 0 pC and 250 pC or smaller, and sq=9 corresponds to a range of larger than 250 pC and 500 pC or smaller. The same applies to sq=10 to sq=14, and sq=15 corresponds to a range of larger than 1750 pC and 2000 pC or smaller.

In addition, each of the cells 61 in the lateral direction of FIG. 7B represents one standardized phase angle sd. Thus, sd=0 corresponds to a range of 0 degree or larger and smaller than 22.5 degrees, and sd=1 corresponds to a range of 22.5 degrees or larger and smaller than 45 degrees in FIG. 7B. The same applies to sd=2 to sd=15.

Next, the distribution pattern generation unit 50 standardizes the charge amount of each of the target partial discharge pulses PL to an integer value from 0 to 15. Then, the distribution pattern generation unit 50 counts up the partial discharge pulse counter of the cell 61 corresponding to a combination of the standardized charge amount and the standardized phase angle generated by the distribution pattern generation unit 50 for each partial discharge pulse PL. Accordingly, the number (that will be hereinafter referred to as the number of partial discharge pulses) sqc of corresponding partial discharge pulses PL is counted for each cell 61.

It should be noted that in order to facilitate understanding, each cell 61 is colored by density according to the number of partial discharge pulses sqc counted by the partial discharge pulse counter of the cell 61 in FIG. 7B. Specifically, in FIG. 7B, a colorless cell means that the number of standardized partial discharge pulses sqc is 0, and each cell 61 is colored so that as the number of standardized partial discharge pulses sqc increases, the density becomes denser in the order of a light gray color, a dark gray color, and a block color.

FIGS. 8A to 8C show the standardized partial discharge charge amount phase angle distribution patterns T' corresponding to FIG. 7A to 7C generated as described above. FIG. 8A shows the standardized partial discharge charge amount phase angle distribution pattern T' obtained by standardizing the partial discharge charge amount phase angle distribution pattern T when the partial discharge is started as described in FIG. 6A, FIG. 8B shows the standardized partial discharge charge amount phase angle distribution pattern T' obtained by standardizing the partial discharge charge amount phase angle distribution pattern T in the middle stage of the partial discharge as described in FIG. 6B, and FIG. 8C shows the standardized partial discharge charge amount phase angle distribution pattern T' obtained by standardizing the partial discharge charge amount phase angle distribution pattern T immediately before breakdown as described in FIG. 6C.

Figure 9:
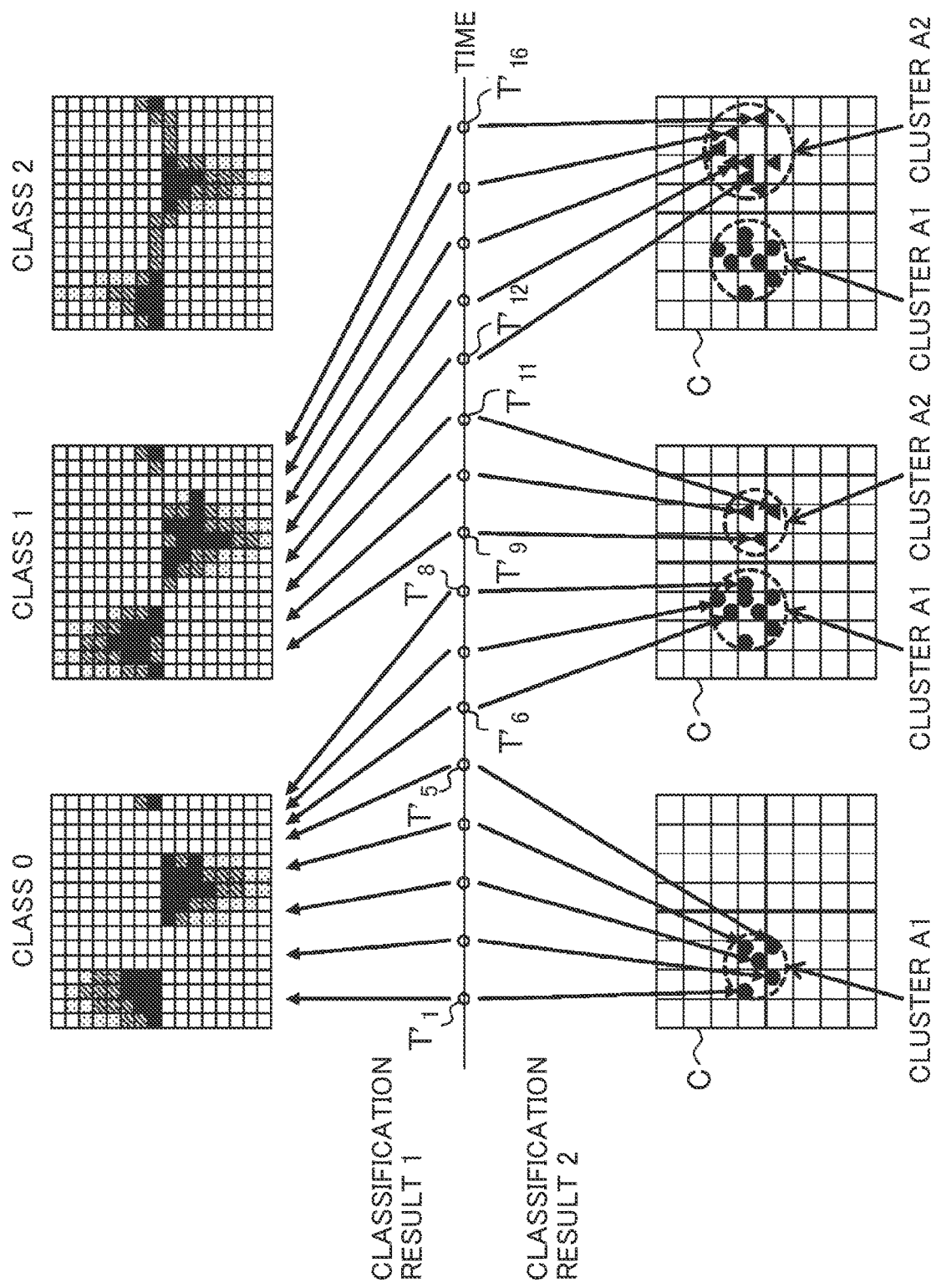
FIG. 9 is a diagram for showing an example of classification results of a first classification unit and classification results of a second classification unit for the standardized partial discharge charge amount phase angle distribution patterns.

FIG. 9 shows a first example of the classification result D2 of the first classification unit 51 (FIG. 4) and the classification result D3 of the second classification unit 52 (FIG. 4) for each standardized partial discharge charge amount phase angle distribution pattern T'.

Here, the first classification unit 51 classifies each standardized partial discharge charge amount phase angle distribution pattern T' into any one of a "class 0" that is the standardized partial discharge charge amount phase angle distribution pattern T' (FIG. 8A) corresponding to FIG. 6A, a "class 1" that is the standardized partial discharge charge amount phase angle distribution pattern T' (FIG. 8B) corresponding to FIG. 6B, and a "class 2" that is the standardized partial discharge charge amount phase angle distribution pattern T' (FIG. 8C) corresponding to FIG. 6C by pattern matching with the standard distribution pattern 45 of each class.

FIG. 9 shows an example in which among standardized partial discharge charge amount phase angle distribution patterns $T_1'$ to $T_{16}'$ of each partial discharge data D1, the first classification unit 51 (FIG. 4) classifies the standardized partial discharge charge amount phase angle distribution patterns $T_1'$ to $T_8'$ into the "class 0", and classifies the standardized partial discharge charge amount phase angle distribution patterns $T_9'$ to $T_{16}'$ into the "class 1".

In addition, the second classification unit 52 projects each of the standardized partial discharge charge amount phase angle distribution patterns $T_1'$ to $T_{16}'$ on a two-dimensional coordinate C where the first feature amount and the second feature amount of data are represented by the horizontal axis and the horizontal axis, respectively, using an algorithm such as a principal component analysis method or k-means clustering, and classifies pieces of data close to each other on the two-dimensional coordinate C into the same cluster.

FIG. 9 shows an example in which among the standardized partial discharge charge amount phase angle distribution patterns $T_1'$ to $T_{16}'$, the second classification unit 52 classifies the standardized partial discharge charge amount phase angle distribution patterns $T_1'$ to $T_5'$ and the standardized partial discharge charge amount phase angle distribution patterns $T_6'$ to $T_8'$ into a "cluster $A_1$", and classifies the standardized partial discharge charge amount phase angle distribution patterns $T_9'$ to $T_{11}'$ and the standardized partial discharge charge amount phase angle distribution patterns $T_{12}'$ to $T_{16}'$ of the partial discharge data D1 into a "cluster $A_2$".

Figure 10:
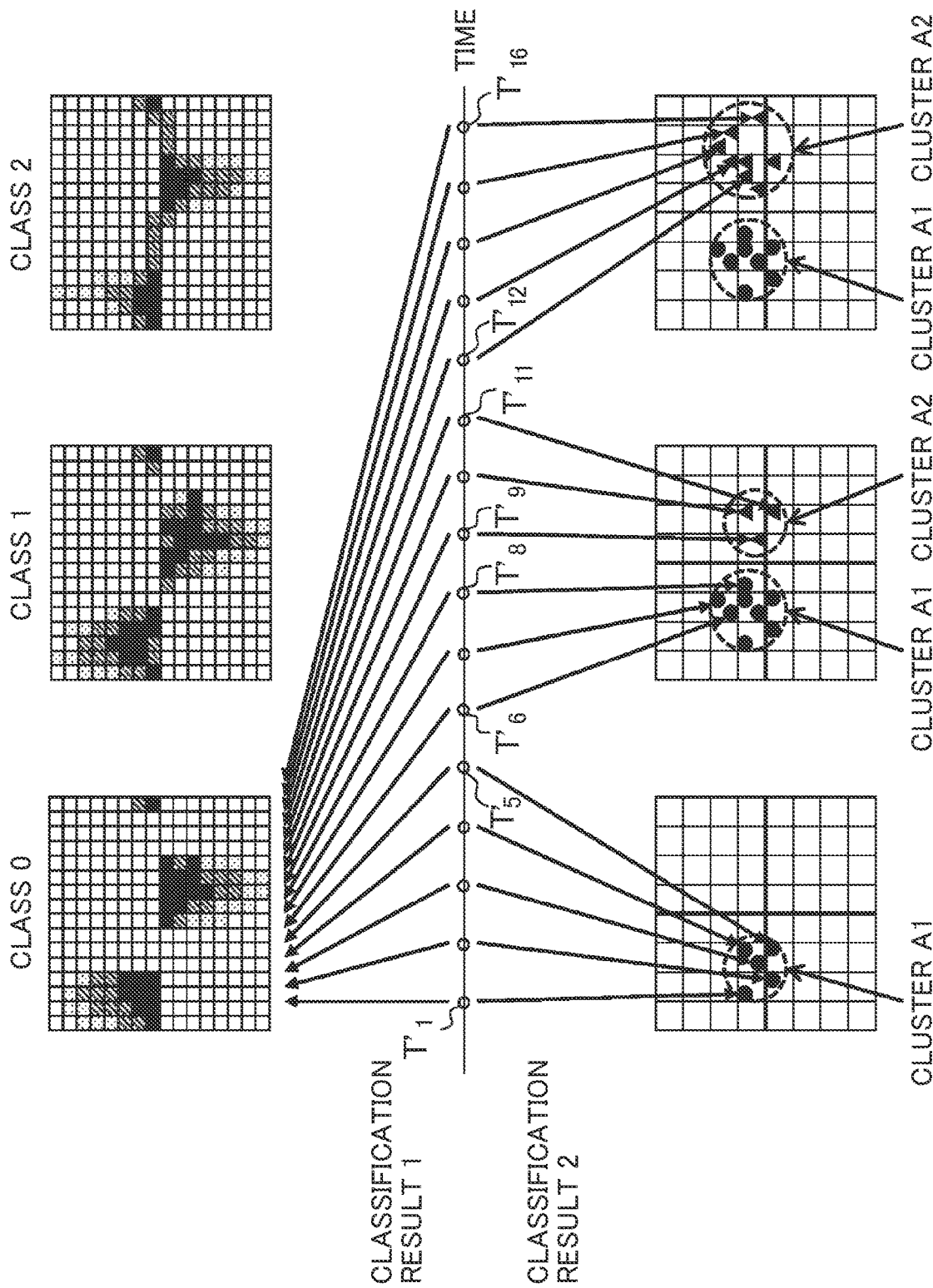
FIG. 10 is a diagram for showing an example of classification results of the first classification unit and classification results of the second classification unit for the standardized partial discharge charge amount phase angle distribution patterns.

On the other hand, FIG. 10 shows a second example of the classification result D2 of the first classification unit 51 and the classification result D3 of the second classification unit 52 for each standardized partial discharge charge amount phase angle distribution pattern T'. As similar to the example of FIG. 9, the first classification unit 51 classifies each standardized partial discharge charge amount phase angle distribution pattern T', and the second classification unit 52 classifies each standardized partial discharge charge amount phase angle distribution pattern T' as similar to the example of FIG. 9.

In FIG. 10, the first classification unit 51 classifies all the standardized partial discharge charge amount phase angle distribution patterns $T_1'$ to $T_{16}'$ into the "class 0". In addition, among the standardized partial discharge charge amount phase angle distribution patterns $T_1'$ to $T_{16}'$, the second classification unit 52 classifies the standardized partial discharge charge amount phase angle distribution patterns $T_1'$ to $T_5'$ and the standardized partial discharge charge amount phase angle distribution patterns $T_6'$ to $T_8'$ into the "cluster $A_1$", and classifies the standardized partial discharge charge amount phase angle distribution patterns $T_9'$ to $T_{11}'$ and the standardized partial discharge charge amount phase angle distribution patterns $T_{12}'$ to $T_{16}'$ into the "cluster $A_2$".

Figure 11:
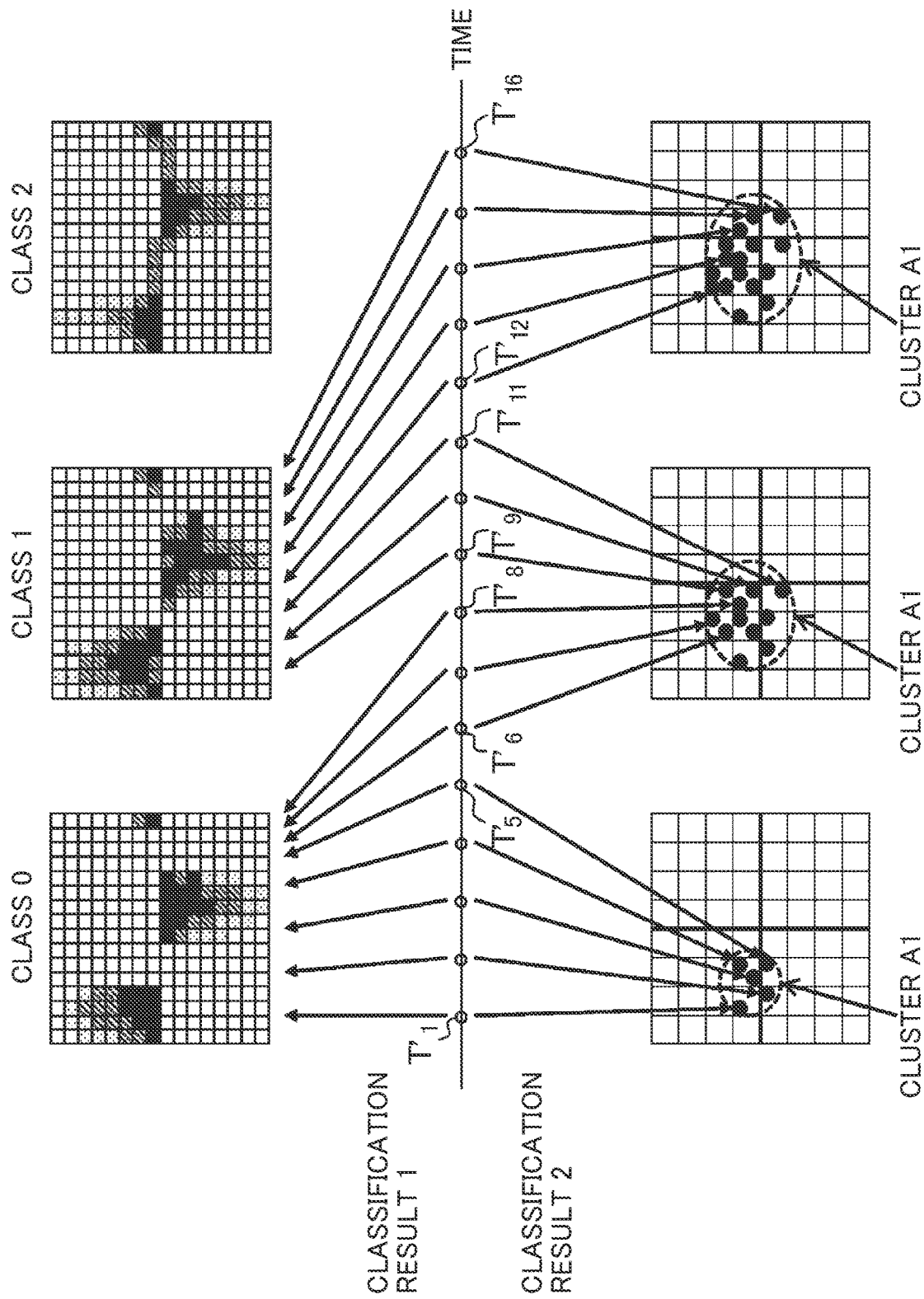
FIG. 11 is a diagram for showing an example of classification results of the first classification unit and classification results of the second classification unit for the standardized partial discharge charge amount phase angle distribution patterns.

On the other hand, FIG. 11 shows a third example of the classification result D2 of the first classification unit 51 and the classification result D3 of the second classification unit 52 for each standardized partial discharge charge amount phase angle distribution pattern T'. As similar to the example of FIG. 9, the first classification unit 51 classifies each standardized partial discharge charge amount phase angle distribution pattern T', and the second classification unit 52 classifies each standardized partial discharge charge amount phase angle distribution pattern T' as similar to the example of FIG. 9.

In FIG. 11, among the standardized partial discharge charge amount phase angle distribution patterns $T_1'$ to $T_{16}'$, the first classification unit 51 classifies the standardized partial discharge charge amount phase angle distribution patterns $T_1'$ to $T_8'$ into the "class 0", and classifies the standardized partial discharge charge amount phase angle distribution patterns $T_9'$ to $T_{16}'$ into the "class 1". In addition, among the standardized partial discharge charge amount phase angle distribution patterns $T_1'$ to $T_{16}'$, the second classification unit 52 classifies all of the standardized partial discharge charge amount phase angle distribution patterns $T_1'$ to $T_5'$, the standardized partial discharge charge amount phase angle distribution patterns $T_6'$ to $T_{11}'$, and the standardized partial discharge charge amount phase angle distribution patterns $T_{12}'$ to $T_{16}'$ into the "cluster $A_1$".

FIG. 12 is a diagram summarizing the classification result (the "classification result 1" of FIG. 12) of the first classification unit 51, the classification result (the "classification result 2" of FIG. 12) of the second classification unit 52, the reliability (the "reliability" of FIG. 12) of the first classification result D2 calculated by the evaluation unit 53 (FIG. 4) on the basis of the second classification result D3, and the result of the evaluation (the "evaluation" of FIG. 12) for the first classification result D2 performed by the evaluation unit 53 (FIG. 4) on the basis of the reliability for the standardized partial discharge charge amount phase angle distribution patterns $T_1'$ to $T_{16}'$ of FIG. 9. It should be noted that the first classification result D2 will be referred to as the "classification result 1", and the second classification result D3 will be referred to as the "classification result 2" in some cases.

In the drawing, "No." indicates each of the identification numbers of the standardized partial discharge charge amount phase angle distribution patterns $T_1'$ to $T_{16}'$ given to the standardized partial discharge charge amount phase angle distribution patterns $T_1'$ to $T_{16}'$. A serial number starting from "1" is given to each of the standardized partial discharge charge amount phase angle distribution patterns $T_1'$ to $T_{16}'$ in the order according to the time of generation.

In the example of FIG. 12, the standardized partial discharge charge amount phase angle distribution patterns $T_1'$ to $T_8'$ (FIG. 9) to which the identification numbers "1" to "8" are given are classified into the "class 0" by the first classification unit 51, and are classified into the "cluster $A_1$" by the second classification unit 52. In addition, the standardized partial discharge charge amount phase angle distribution patterns $T_9'$ to $T_{16}'$ to which the identification numbers "9" to "16" are given are classified into the "class 1" by the first classification unit 51, and are classified into the "cluster $A_2$" by the second classification unit 52.

The reliability of the classification result (classification result 1) of each of the standardized partial discharge charge amount phase angle distribution patterns to $T_{16}'$ by the first classification unit 51 can be calculated by the following formula, [Formula 3]

$$R_i = \Sigma_{k=1}^{n} r_i A_k = r_i A_1 + r_i A_2 + \ldots + r_i A_n \qquad (3)$$

where, for example, the reliability having the classification result 1 as a class i (i=0, 1, 2 and so on) is $R_i$.

It should be noted that "n" in the formula (3) is the number of clusters generated by the second classification unit 52 so far. In addition, $r_i A_k$ (k=1, 2, , , n) in the formula (3) is calculated by squaring the ratio of the classification result 1 as the "class i" and the classification result 2 as the "cluster $A_k$" to the standardized partial discharge charge amount phase angle distribution patterns T' in which the classification result 1 and the classification result 2 are obtained so far as represented by the following formula.
[Formula 4]

$r_i A_k$=(the number of distribution patterns having classification result 2 as cluster $A_k$ among those having classification result 1 as class i/the number of distribution patterns having classification result 1 as i) (4)

For example, in the example of FIG. 12, in the stage where the classification result 1 and the classification result 2 of the standardized partial discharge charge amount phase angle distribution pattern $T_8'$ (FIG. 9) to which the identification number "8" is given are obtained, the number of standardized partial discharge charge amount phase angle distribution patterns T' in which the classification result 1 same as the "class 0" that is the classification result 1 of the standardized partial discharge charge amount phase angle distribution pattern $T_8'$ to which the identification number "8" is given is obtained is 8 pieces of standardized partial discharge charge amount phase angle distribution patterns $T_1'$ to $T_8'$ to which the identification numbers "1" to "8" are given. In addition, the number of standardized partial discharge charge amount phase angle distribution patterns T' in which the classification result 2 same as the "cluster $A_1$" that is the classification result 2 of the standardized partial discharge charge amount phase angle distribution pattern $T_8'$ is obtained is also 8 pieces of standardized partial discharge charge amount phase angle distribution patterns $T_1'$ to $T_8'$ to which the identification numbers "1" to "8" are given, and thus the reliability $R_0$ of the classification result 1 of the standardized partial discharge charge amount phase angle distribution pattern $T_8'$ by the first classification unit 51 is calculated as "1" as in the following formula.

[Formula 5]

$$R_0 = r_0 A_1 = \left(\frac{8}{8}\right)^2 = 1 \qquad (5)$$

In addition, in the example of FIG. 12, in the stage where the classification result 1 and the classification result 2 of the standardized partial discharge charge amount phase angle distribution pattern $T_{12}'$ (FIG. 9) to which the identification number "12" is given are obtained, the number of standardized partial discharge charge amount phase angle distribution patterns T' in which the classification result 1 same as the "class 1" that is the classification result 1 of the standardized partial discharge charge amount phase angle distribution pattern $T_{12}'$ to which the identification number "12" is given is obtained is 4 pieces of standardized partial discharge charge amount phase angle distribution patterns $T_9'$ to $T_{12}'$ to which the identification numbers "9" to "12" are given. In addition, the number of standardized partial discharge charge amount phase angle distribution patterns T' in which the classification result 2 same as the "cluster $A_2$" that is the classification result 2 of the standardized partial discharge charge amount phase angle distribution pattern $T_{12}'$ is obtained is also 4 pieces of standardized partial discharge charge amount phase angle distribution patterns $T_9'$ to $T_{12}'$ to which the identification numbers "9" to "12" are given, and thus the reliability $R_1$ of the classification result of the standardized partial discharge charge amount phase angle distribution pattern $T_{12}'$ by the first classification unit 51 is calculated as "1" as in the following formula.

[Formula 6]

$$R_1 = r_1 A_1 + r_1 A_2 = \left(\frac{o}{4}\right)^2 + \left(\frac{4}{4}\right)^2 = 1 \qquad (6)$$

The "evaluation" in FIG. 12 is a value representing whether or not to permit to use the classification result (classification result 1) of the first classification unit 51 as data when the determination unit 54 (FIG. 4) determines the degree of insulation deterioration of the target underground power transmission cable 2, and is decided by the evaluation unit 53 (FIG. 4). The "permission" in the drawing means to permit to use the corresponding classification result 1 as data when the determination unit 54 determines the degree of insulation deterioration of the target underground power transmission cable 2, and the "non-permission" means not to permit to use the corresponding classification result 1 as data when the determination unit 54 determines the degree of insulation deterioration of the target underground power transmission cable 2. In the case of the embodiment, in the case where the reliability is larger than "0.5" on the basis of the reliability of the classification result 1, the evaluation unit 53 determines as "permission", and in the case where the reliability is equal to or smaller than "0.5", the evaluation unit 53 determines as "non-permission".

Thus, in the case of the example of FIG. 12, the determination unit 54 determines the degree of progress of the partial discharge occurring in the target underground power transmission cable 2 using information of all the standardized partial discharge charge amount phase angle distribution patterns $T_1'$ to $T_{16}'$ to which the identification numbers "1" to "16" are given, and displays the determination result.

On the other hand, FIG. 13 is a diagram summarizing the classification result of the first classification unit 51, the classification result of the second classification unit 52, the reliability of the classification result 1 calculated on the basis of the classification result 2, and the result of the evaluation for the classification result 1 performed by the evaluation unit 53 on the basis of the reliability for the standardized partial discharge charge amount phase angle distribution patterns $T_1'$ to $T_{16}'$ of FIG. 10. The meanings of "No.", "classification result 1", "classification result 2", "reliability", and "evaluation" in the drawing are the same as those in FIG. 12, and thus the explanation thereof is omitted here.

In this example, the standardized partial discharge charge amount phase angle distribution patterns $T_1'$ to $T_8'$ (FIG. 10) to which the identification numbers "1" to "8" are given are classified into the "class 0" by the first classification unit 51 and are classified into the "cluster $A_1$" by the second classification unit 52. Therefore, as similar to the case of FIG. 10, each reliability of the classification results 1 for the standardized partial discharge charge amount phase angle distribution patterns $T_1'$ to $T_8'$ is "1".

In addition, the standardized partial discharge charge amount phase angle distribution patterns $T_9'$ to $T_{16}'$ to which the identification numbers "9" to "16" are given are classified into the "class 0" by the first classification unit 51 and are classified into the "cluster $A_2$" by the second classification unit 52. Therefore, for example, in the stage where the classification result 1 and the classification result 2 of the standardized partial discharge charge amount phase angle distribution pattern $T_9'$ to which the identification number "9" is given are obtained, the number of standardized partial discharge charge amount phase angle distribution patterns T' in which the classification result 1 same as the "class 0" that is the classification result 1 of the standardized partial discharge charge amount phase angle distribution pattern $T_9'$ is obtained is 9 pieces of standardized partial discharge charge amount phase angle distribution patterns $T_1'$ to $T_9'$ to which the identification numbers "1" to "9" are given. In addition, the number of standardized partial discharge charge amount phase angle distribution patterns T' in which the classification result 2 same as the "cluster $A_2$" that is the classification result 2 of the standardized partial discharge charge amount phase angle distribution pattern $T_9'$ is obtained is one piece of standardized partial discharge charge amount phase angle distribution pattern $T_9'$ to which the identification number "9" is given, and the number of standardized partial discharge charge amount phase angle distribution patterns T' in which the classification result 2 as the "cluster $A_1$" is obtained is 8 pieces of standardized partial discharge charge amount phase angle distribution patterns $T_1'$ to $T_8'$ to which the identification numbers "1" to "8" are given. Thus, the reliability $R_0$ of the classification result 1 of the standardized partial discharge charge amount phase angle distribution pattern $T_9'$ by the first classification unit 51 is calculated as "0.802" as in the following formula.

[Formula 7]

$$R_0 = r_0 A_1 + r_0 A_2 = \left(\frac{8}{9}\right)^2 + \left(\frac{1}{9}\right)^2 = 0.802 \ldots \quad (7)$$

In addition, in the embodiment, in the case where the reliability is equal to or smaller than "0.5", the data of the standardized partial discharge charge amount phase angle distribution pattern T' is not permitted to be used as data when the determination unit 54 determines the degree of insulation deterioration of the target underground power transmission cable 2 as described above. Thus, whereas each data of the standardized partial discharge charge amount phase angle distribution patterns $T_1'$ to $T_{15}'$ to which the identification numbers "1" to "15" are given is "permission", the data of the standardized partial discharge charge amount phase angle distribution pattern $T_{16}'$ to which the identification number "16" is given is "non-permission".

Thus, in the case of the example of FIG. 13, the determination unit 54 determines the degree of progress of the partial discharge occurring in the target underground power transmission cable 2 using only information of the standardized partial discharge charge amount phase angle distribution patterns $T_1'$ to $T_{15}'$ evaluated as "permission" by the evaluation unit 53, and displays the determination result.

On the other hand, FIG. 14 is a diagram summarizing the classification result (classification result 1) of the first classification unit 51, the classification result (classification result 2) of the second classification unit 52, the reliability of the classification result 1 calculated on the basis of the classification result 2, and the result of the evaluation for the classification result 1 performed by the evaluation unit 53 on the basis of the reliability for the standardized partial discharge charge amount phase angle distribution patterns $T_1'$ to $T_{16}'$ of FIG. 11. The meanings of "No.", "reliability", and "evaluation" in the drawing are the same as those in FIG. 12, and thus the explanation thereof is omitted here.

In this example, the standardized partial discharge charge amount phase angle distribution patterns $T_1'$ to $T_8'$ (FIG. 11) to which the identification numbers "1" to "8" are given are classified into the "class 0" by the first classification unit 51 and are classified into the "cluster $A_1$" by the second classification unit 52. Therefore, as similar to the case of FIG. 10, each reliability of the classification results 1 for the standardized partial discharge charge amount phase angle distribution patterns $T_1'$ to $T_8'$ is "1".

In addition, the standardized partial discharge charge amount phase angle distribution patterns $T_9'$ to $T_{16}'$ (FIG. 11) to which the identification numbers "9" to "16" are given are classified into the "class 1" by the first classification unit 51 and are classified into the "cluster $A_1$" by the second classification unit 52. Therefore, for example, in the stage where the classification result 1 and the classification result 2 of the standardized partial discharge charge amount phase angle distribution pattern $T_9'$ to which the identification number "9" is given are obtained, the number of standardized partial discharge charge amount phase angle distribution patterns T' in which the classification result 1 same as the "class 1" that is the classification result 1 of the standardized partial discharge charge amount phase angle distribution pattern $T_9'$ is obtained is one piece of standardized partial discharge charge amount phase angle distribution pattern $T_9'$ to which the identification number "9" is given. In addition, the number of standardized partial discharge charge amount phase angle distribution patterns T' in which the classification result 2 same as the "cluster $A_1$" that is the classification result 2 of the standardized partial discharge charge amount phase angle distribution pattern $T_9'$ is obtained is one piece of standardized partial discharge charge amount phase angle distribution pattern $T_9'$ to which the identification number "9" is given. Thus, the reliability $R_1$ of the classification result 1 of the standardized partial discharge charge amount phase angle distribution pattern $T_9'$ by the first classification unit 51 is calculated as "1" as in the following formula.

[Formula 8]

$$R_1 = r_1 A_1 = \left(\frac{1}{1}\right)^2 = 1 \quad (8)$$

It should be noted that as a case in which the classification results 2 are the same irrespective of different classification results 1, there is a case in which the resemblance of the values of data is high even if the standardized partial discharge charge amount phase angle distribution patterns T' are different from each other.

In addition, in the embodiment, in the case where the reliability is equal to or smaller than "0.5", the data of the standardized partial discharge charge amount phase angle distribution pattern T' is not permitted to be used as data when the determination unit 54 determines the degree of insulation deterioration of the target underground power transmission cable 2. Thus, each data of the standardized partial discharge charge amount phase angle distribution patterns $T_1'$ to $T_{16}'$ to which the identification numbers "1" to "16" are given is "permission".

Thus, in the case of the example of FIG. 14, the determination unit 54 determines the degree of progress of the partial discharge occurring in the target underground power transmission cable 2 using information of all the standardized partial discharge charge amount phase angle distribution patterns $T_1'$ to $T_{16}'$ to which the identification numbers "1" to "16" are given, and displays the determination result.

(1-4) Effect of the Embodiment

As described above, in the underground power transmission cable deterioration determination system 1 of the embodiment, the reliability of the classification result 1 of the standardized partial discharge charge amount phase angle distribution pattern T' obtained by the first classification unit 51 is evaluated using the classification result 2 of the standardized partial discharge charge amount phase angle distribution pattern T' obtained by the second classification unit 52, and the degree of progress of the partial discharge occurring in the target underground power transmission cable 2 is determined using only information of the highly-reliable standardized partial discharge charge amount phase angle distribution pattern T'.

Thus, according to the underground power transmission cable deterioration determination system 1, the degree of progress of the partial discharge occurring in the underground power transmission cable 2 can be highly reliably determined without preparing plural standard patterns, and thus the degree of insulation deterioration of the underground power transmission cable 2 can be accurately determined.

(2) Second Embodiment

In FIG. 1, the reference numeral 70 denotes, as a whole, an underground power transmission cable deterioration determination system 70 according to a second embodiment. The underground power transmission cable deterioration determination system 70 is configured similar to the underground power transmission cable deterioration determination system 1 of the first embodiment except for a partial discharge determination device 71.

Figure 15:
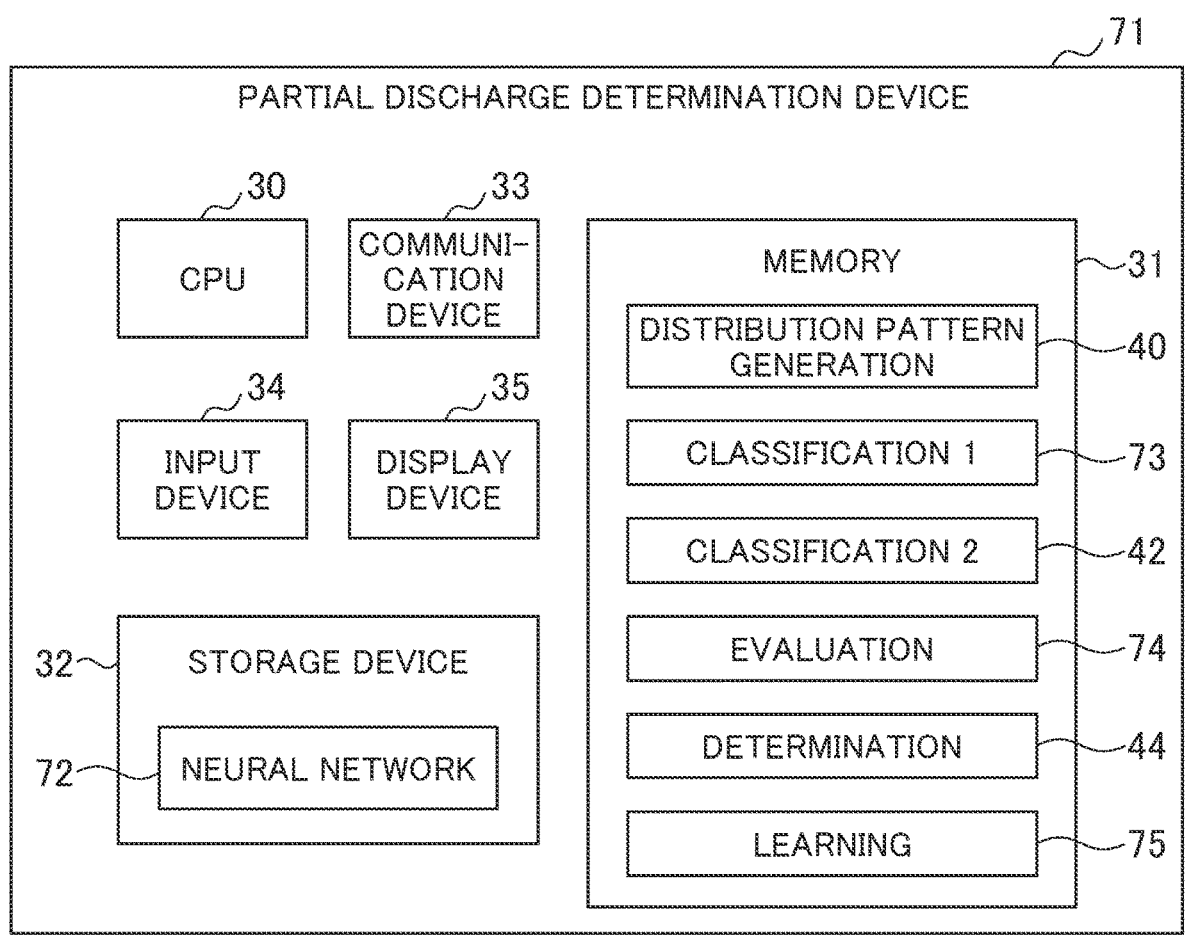
FIG. 15 is a block diagram for showing an outline hardware configuration of a partial discharge determination device according to a second embodiment.

FIG. 15 in which the corresponding parts of FIG. 3 are followed by the same reference numerals shows an outline hardware configuration of the partial discharge determination device 71 of the embodiment. The partial discharge determination device 71 is different from the partial discharge determination device 5 of the first embodiment in that instead of the data of the standard distribution pattern 45 described in FIG. 3, data of a neural network 72 is held by the memory 31, some functions of the first classification program 73 and the evaluation program 74 are different, and a learning program 75 is stored in the memory 31.

Figure 16:
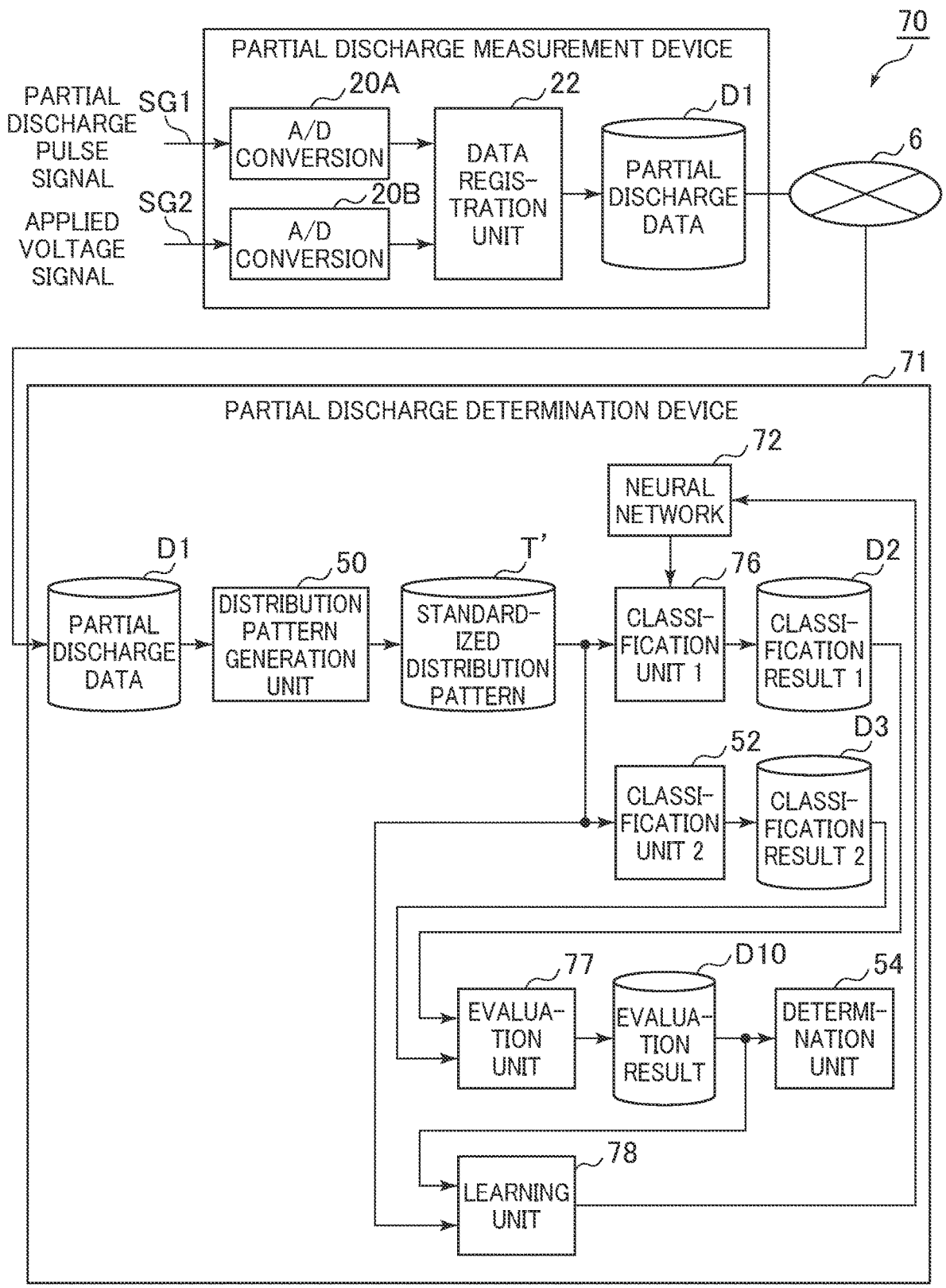
FIG. 16 is a block diagram for showing a flow of a series of processes in an underground power transmission cable deterioration determination system according to the second embodiment.

FIG. 16 in which the corresponding parts of FIG. 4 are followed by the same reference numerals shows a flow of a series of processes (partial discharge progress degree determination process) executed in the underground power transmission cable deterioration determination system 70 according to the embodiment in which the degree of progress of partial discharge in the target underground power transmission cable 2 is determined. In the drawing, a first classification unit 76, an evaluation unit 77, and a learning unit 78 are functional units that are embodied in such a manner that the CPU 30 executes the first classification program 73, the evaluation program 74, or the learning program 75 described in FIG. 3 loaded from the storage device 32 (FIG. 3) into the memory 31 (FIG. 3) in the partial discharge determination device 71.

The neural network 72 is a mathematical model obtained by preliminarily learning the standard distribution pattern 45 of each class described in FIG. 3. The first classification unit 76 classifies the standardized partial discharge charge amount phase angle distribution patterns T' sequentially generated by the distribution pattern generation unit 50 into the corresponding classes using the neural network 72, and the classified class is stored into the storage device 32 (FIG. 3) as the first classification result D2 while being associated with the standardized partial discharge charge amount phase angle distribution pattern T'.

In addition, as similar to the first embodiment, the evaluation unit 77 calculates a value ("permission" or "non-permission") indicating whether or not to permit to use information of the standardized partial discharge charge amount phase angle distribution pattern T' as data when the degree of progress of the partial discharge in the target underground power transmission cable 2 is determined for each standardized partial discharge charge amount phase angle distribution pattern T', and stores, in addition to the value, the reliability obtained in the course of obtaining the value into the storage device 32 as an evaluation result D10 of the corresponding standardized partial discharge charge amount phase angle distribution pattern T'.

The learning unit 78 performs learning of the neural network 72 on the basis of the data of each standardized partial discharge charge amount phase angle distribution pattern T' stored in the storage device 32 and the evaluation result D10 of the evaluation unit 77 stored in the storage device 32. Specifically, in the case where the reliability is lowered as, for example, each of the standardized partial discharge charge amount phase angle distribution patterns $T_9'$ to $T_{16}'$ (FIG. 10) to which the identification numbers "9" to "16" are given in FIG. 13, the learning unit 78 performs learning using the standardized partial discharge charge amount phase angle distribution patterns $T_9'$ to $T_{16}'$ as teacher data, and updates the neural network 72 so as to add a new class.

According to the underground power transmission cable deterioration determination system 70 of the embodiment having the above-described configuration, the insufficient learning of the neural network 72 can be performed during the operation of the underground power transmission cable deterioration determination system 70, and thus the accuracy of classifying the standardized partial discharge charge amount phase angle distribution patterns T' by the first classification unit 76 can be improved. Accordingly, the degree of progress of the partial discharge can be more highly reliably determined.

(3) Other Embodiments

It should be noted that in the above-described first and second embodiments, the present invention is applied to the partial discharge determination device 5 that determines the degree of progress of the partial discharge in the underground power transmission cable 2. However, the present invention is not limited to this, and can be widely applied to various partial discharge determination devices that determine the degree of progress of the partial discharge in a power transmission cable other than the underground power transmission cable 2.

In addition, in the above-described first and second embodiments, the charge amount and the occurrence phase angle are standardized using a set of data of the partial discharge pulses PL occurring in a period of 50 cycles of the applied voltage of the target underground power transmission cable 2. However, the present invention is not limited to this, and the charge amount and the occurrence phase angle may be standardized using a set of data of the partial discharge pulses PL occurring in a period of one or more cycles other than the period of 50 cycles.

Further, in the above-described first and second embodiments, each reliability of the classification results of the first classification units 51 and 76 is calculated using the above-described formula (3). However, the present invention is not limited to this, and each reliability of the classification results of the first classification units 51 and 76 may be calculated using other various methods.

The present invention can be widely applied to various partial discharge determination devices that determine the degree of progress of partial discharge occurring in a power transmission cable.

What is claimed is:

1. A partial discharge determination device that determines the degree of progress of partial discharge occurring in a power transmission cable, the device comprising:

A processor coupled to a memory that stores instructions that when executed by the processor, configure the processor to execute:

a distribution pattern generation unit that sequentially generates a distribution pattern within a determined window of a charge amount and an occurrence phase angle of each partial discharge pulse occurring in a period of one or more cycles of an applied voltage of the power transmission cable, the applied voltage is a voltage of electricity applied to the power transmission cable at a time each pulse occurs;

a first classification unit that classifies the distribution pattern generated by the distribution pattern generation unit into any one of a plurality of classes on basis of a standard distribution pattern for each of the plurality of classes;

a second classification unit that classifies the distribution pattern generated by the distribution pattern generation unit into any one of a plurality of clusters by clustering;

an evaluation unit that evaluates a classification result of the first classification unit based on a classification result of the second classification unit, and calculates a reliability of the classification result of the first classification unit based on the classification result of the second classification unit, and evaluates the classification result of the first classification unit based on the calculated reliability to determine an evaluation result; and a determination unit that determines a degree of progress of the partial discharge occurring in the power transmission cable based on the evaluation result of the evaluation unit, wherein the evaluation unit calculates the reliability of the classification result of the first classification unit for the distribution pattern as a class i (i=0, 1, 2 . . . ) using the following formula, and

[Formula 1]

$$R_i = \Sum_{k=1}^{n} r_i A_k \quad (1)$$

wherein the reliability of the classification result of the first classification unit is $R_i$, the number of clusters classified by the second classification unit so far is n, and the square of a ratio of the class having a classification result i of the first classification unit and the cluster having a classification result $A_k$ of the second classification unit to the distribution patterns in which the classification result by the first classification unit and the classification result by the second classification unit are obtained so far is $r_i A_k$.

2. The partial discharge determination device according to claim 1, wherein the first classification unit classifies the distribution pattern generated by the distribution pattern generation unit into any one of the classes using a neural network having learned the standard distribution pattern for each class, and wherein the processor is further configured to execute a learning unit that learns the distribution pattern on the basis of the evaluation result of the evaluation unit to update the neural network.

3. A partial discharge determination method executed by a partial discharge determination device that determines a degree of progress of partial discharge occurring in a power transmission cable, the method comprising:

sequentially generating a distribution pattern within a determined window of a charge amount and an occurrence phase angle of each partial discharge pulse occurring in a period of one or more cycles of an applied voltage of the power transmission cable, the applied voltage is a voltage of electricity applied to the power transmission cable at a time each pulse occurs;

executing a first classification process in which the generated distribution pattern is classified into any one of a plurality of classes on the basis of a standard distribution pattern for each of the plurality of classes and a second classification process in which the generated distribution pattern is classified into any one of a plurality of clusters by clustering;

evaluating a classification result by the first classification process based on a classification result by the second classification process, calculating a reliability of the classification result of the first classification process based on the classification result of the second classification process, and evaluating the classification result of the first classification process unit based on the calculated reliability to determine an evaluation result; and determining a degree of progress of the partial discharge occurring in the power transmission cable based on the evaluation result, wherein the evaluation process calculates the reliability of the classification result of the first classification process for the distribution pattern as a class i (i=0, 1, 2 . . . ) using the following formula, and [Formula 1]

$$R_i = \Sum_{k=1}^{n} r_i A_k \quad (1)$$

wherein the reliability of the classification result of the first classification process is $R_i$, the number of clusters classified by the second classification process so far is n, and the square of a ratio of the class having a classification result i of the first classification process and the cluster having a classification result $A_k$ of the second classification process to the distribution patterns in which the classification result by the first classification process and the classification result by the second classification process are obtained so far is $r_i A_k$.

4. The partial discharge determination method according to claim 3, wherein, the generated distribution pattern is classified into any one of the classes using a neural network having learned the standard distribution pattern for each class, and wherein the method further comprises a learning step of learning the distribution pattern on the basis of the evaluation result in the third step to update the neural network.

\* \* \* \* \*